(12) United States Patent
Velichko

(10) Patent No.: US 10,567,689 B2
(45) Date of Patent: Feb. 18, 2020

(54) IMAGE SENSORS HAVING MULTI-STORAGE IMAGE SENSOR PIXELS

(71) Applicant: SEMICONDUCTOR COMPONENTS INDUSTRIES, LLC, Phoenix, AZ (US)

(72) Inventor: Sergey Velichko, Boise, ID (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 15/974,452

(22) Filed: May 8, 2018

(65) Prior Publication Data

US 2019/0349547 A1 Nov. 14, 2019

(51) Int. Cl.
*H04N 5/225* (2006.01)
*H04N 5/3745* (2011.01)
*H01L 27/146* (2006.01)
*H01L 25/16* (2006.01)
*H04N 5/374* (2011.01)

(52) U.S. Cl.
CPC ....... *H04N 5/37452* (2013.01); *H01L 25/167* (2013.01); *H01L 27/14645* (2013.01); *H04N 5/2253* (2013.01); *H04N 5/2254* (2013.01)

(58) Field of Classification Search
CPC ............... H04N 5/378; H04N 5/37457; H04N 5/37452; H04N 5/3559; H04N 5/35581; H04N 5/35554; H01L 27/14656; H01L 27/14641; H01L 27/14627
See application file for complete search history.

(56) References Cited

U.S. PATENT DOCUMENTS

| 9,900,481 | B2* | 2/2018 | Geurts | H04N 5/2253 |
| 2010/0323470 | A1 | 12/2010 | Venezia et al. | |
| 2013/0044247 | A1* | 2/2013 | Kawahito | H04N 5/35581 348/296 |
| 2014/0077323 | A1 | 3/2014 | Velichko et al. | |
| 2015/0373291 | A1* | 12/2015 | Oh | H04N 5/3575 348/324 |
| 2017/0244921 | A1 | 8/2017 | Velichko | |
| 2018/0115731 | A1* | 4/2018 | Lee | H04N 5/37452 |

* cited by examiner

*Primary Examiner* — Hung H Lam

(74) *Attorney, Agent, or Firm* — Treyz Law Group, P.C.; Tianyi He

(57) ABSTRACT

An image sensor pixel may include a photodiode, one or more storage diodes, one or more potential barrier structures, one or more capacitors, and a floating diffusion region. The photodiode may be coupled to a storage diode and a first capacitor, and a first potential barrier structure may be interposed between the storage diode and the first capacitor. The photodiode may also be coupled to additional storage diodes and additional capacitors in a similar manner. Additionally, the photodiode may be directly separated from a given capacitor via a corresponding potential barrier structure. Each capacitor may store overflow charge from one or more storage diodes and/or the photodiode and may be connected to the floating diffusion via respective transistors.

21 Claims, 18 Drawing Sheets

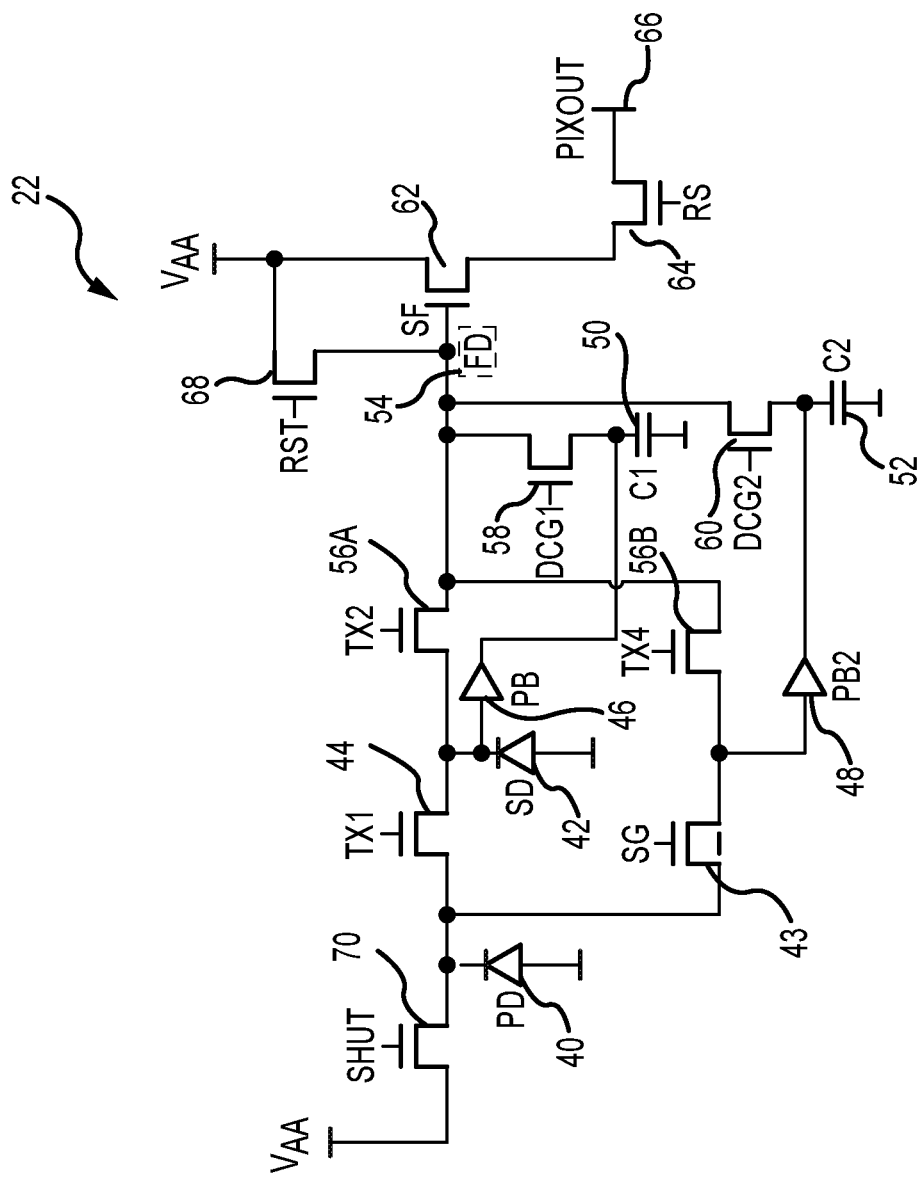

IMAGE SENSORS HAVING MULTI-STORAGE IMAGE SENSOR PIXELS

BACKGROUND

This relates generally to imaging devices, and more particularly, to imaging devices having multi-storage image sensor pixels.

Image sensors are commonly used in electronic devices such as cellular telephones, cameras, and computers to capture images. In a typical arrangement, an electronic device is provided with an array of image pixels arranged in pixel rows and pixel columns. Circuitry is commonly coupled to each pixel column for reading out image signals from the image pixels.

The image pixels each contain a photodiode for generating charge in response to image light and a corresponding charge storage region or regions. The image pixels may be configured to have a wide range of functionalities. However, pixels with charge storages are not immune to parasitic light or charge leakage resulting in degraded image quality. This effect is measured as global shutter efficiency in pixels. Additionally dark current of the storage regions may further degrade image quality. To improve global shutter efficiency and dark current as well as to more efficiently provide these functionalities in the image pixels, new pixel structures and configurations may be necessary.

It would therefore be desirable to be able to provide imaging devices with improved image sensor pixels with charge storage regions.

BRIEF DESCRIPTION OF THE DRAWINGS

FIG. 6A is a circuit diagram of an illustrative image sensor pixel having capacitors respectively coupled to a storage diode and a storage gate in accordance with an embodiment.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
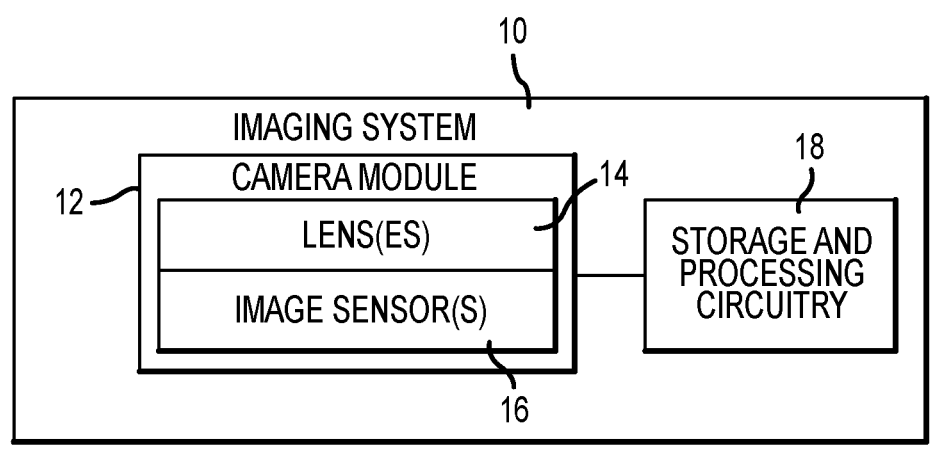
FIG. 1 is a diagram of an illustrative electronic device having an image sensor and processing circuitry for capturing images using an array of image pixels in accordance with an embodiment.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

Figure 2:
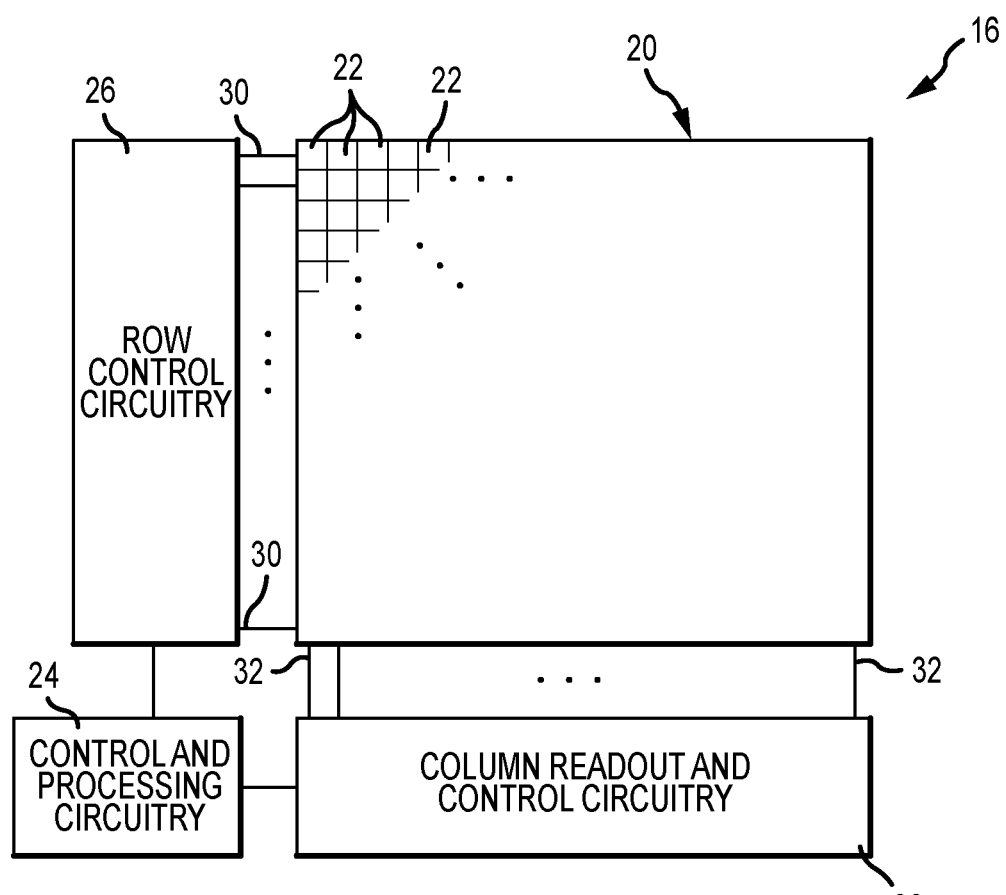
FIG. 2 is a diagram of an illustrative pixel array and associated readout circuitry for reading out image signals from the pixel array in accordance with an embodiment.

As shown in FIG. 2, image sensor 16 may include a pixel array 20 containing image sensor pixels 22 arranged in rows and columns (sometimes referred to herein as image pixels or pixels) and control and processing circuitry 24. Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

If desired, image pixels 22 may include one or more photosensitive regions for generating charge in response to image light. Photosensitive regions within image pixels 22 may be arranged in rows and columns on array 20. Pixel array 20 may be provided with a color filter array having multiple color filter elements, which allows a single image sensor to sample light of different colors. As an example, image sensor pixels such as the image pixels in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another suitable example, the green pixels in a Bayer pattern are replaced by broadband image pixels having broadband color filter elements (e.g., clear color filter elements, yellow color filter elements, etc.). These examples are merely illustrative and, in general, color filter elements of any desired color and in any desired pattern may be formed over any desired number of image pixels 22.

For a broad range of applications, it may be desirable to provides image sensor pixels such as pixel 22 in FIG. 2 that include high dynamic range (HDR) functionality, light flickering mitigation (LFM) functionality, and other functionalities, and that operate in global shutter mode (as well as rolling shutter mode). Additionally, it may be desirable to provide efficient and scalable pixel configurations to achieve the above-mentioned pixel properties.

Figure 3A:
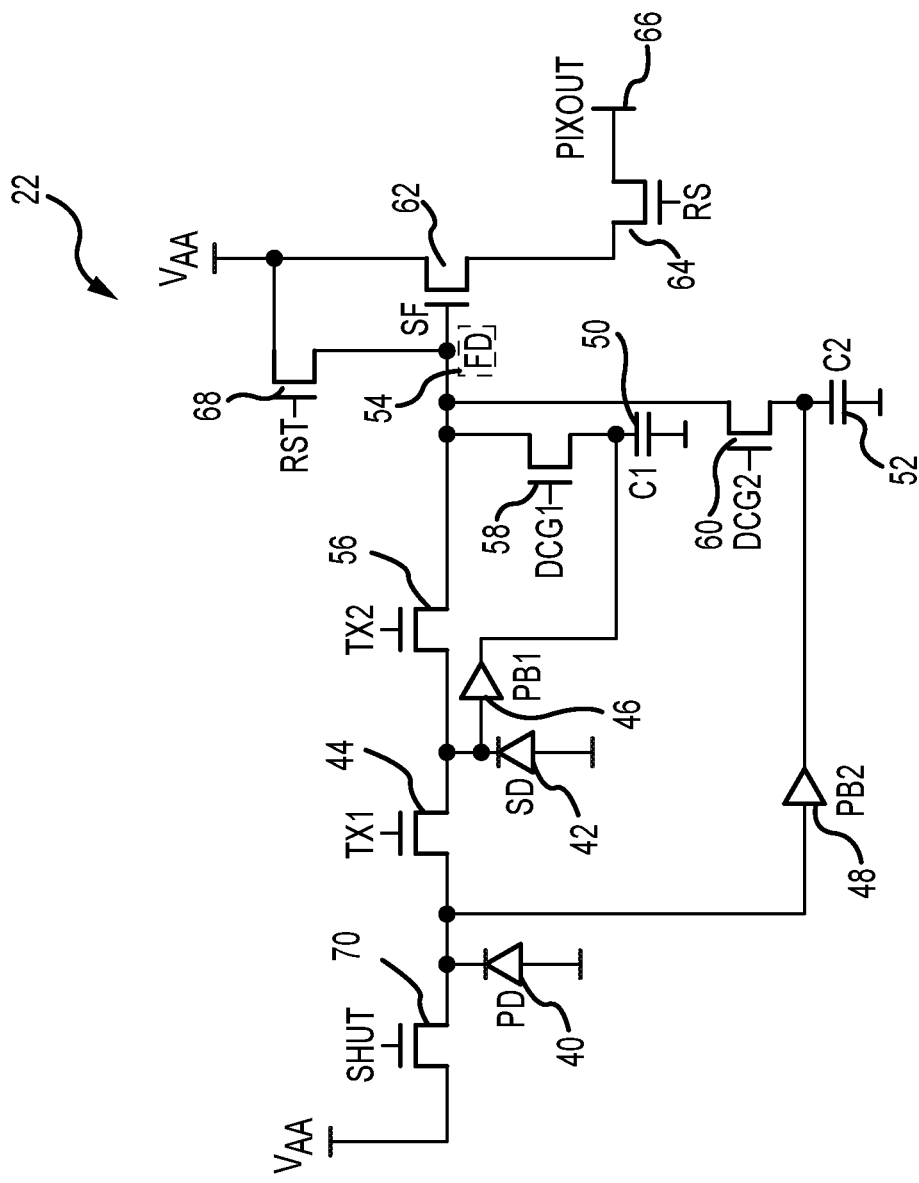
FIG. 3A is a circuit diagram of an illustrative image sensor pixel having capacitors respectively coupled to potential barriers in accordance with an embodiment.

FIG. 3A is a circuit diagram of an illustrative image sensor pixel (e.g., pixel 22) that includes potential barriers used to efficiently provide HDR and LFM operations in either global shutter and rolling shutter modes. In particular, pixel 22 may include photosensitive region 40 (e.g., photodiode 40, pinned photodiode 40) and storage diode 42. Transfer transistor 44 may be interposed between photodiode 40 and storage diode 42, thereby electrically connecting photodiode 40 to storage diode 42 when control signal TX1 is asserted (i.e., is at a value that activates the corresponding transistor, thereby making the drain and source terminals of the corresponding transistor conductive). Potential barrier 46 may couple storage diode 42 to a charge storage structure (e.g., capacitor 50). Potential barrier 48 may couple photodiode 40 to an additional charge storage structure (e.g., capacitor 52). As an example, potential barriers 46 and 48 may be formed from a doped region (e.g., a shallow implant region, a p- and n-doped implant region, a region with an opposite doping type from a region coupled to the potential barrier, a region with an opposite doping type from a photosensitive region, etc.) in a substrate forming pixel 22. As another example, potential barriers 46 and 48 (sometimes referred to herein as potential barrier structures) may be formed as any type of barrier diode. As yet another example, potential barriers 46 and 48 may be implemented as transistors configured with potential barrier properties (e.g., transistors that leak charge above a given potential barrier, transistors that are voltage-biased to leak charge across the channel regions, etc.). Potential barriers 46 and 48 may provide respective pinned potentials (i.e., pinning voltages) associated with the doping of the respective doped regions.

Pixel 22 may also include floating diffusion region 54 (e.g., floating diffusion 54) that is coupled to storage diode 42 via transfer transistor 56 (e.g., transfer transistor 56 may be interposed between floating diffusion region 42 and storage diode 42. Additionally, floating diffusion region 54 may be coupled to capacitors 50 and 52 respectively via transistors 58 and 60 (e.g., dual conversion gain transistors 58 and 60). Floating diffusion region 54 be coupled to readout circuitry that read out signals stored at floating diffusion region 54. The readout circuitry may include source follower transistor 62 and row select transistor 64, as an example. In particular, floating diffusion 54 may be coupled to a gate terminal of source follower transistor 62. A first source-drain terminal of transistor 62 may be coupled to a voltage supply source (e.g., a power supply source, a voltage supply source the provides supply voltage $V_{AA}$), and a second source-drain terminal of transistor 62 may be coupled to a first source-drain terminal of transistor 64. The second source-drain terminal of transistor 64 may be coupled to pixel output line 66.

Floating diffusion region 54 may be coupled to a supply voltage source via transistor 68 (e.g., floating diffusion reset transistor 68). As an example, when control signal RST of transistor 68 is asserted, floating diffusion 54 may be reset close to a reference voltage (e.g., a reset voltage $V_{AA}$). Photodiode 40 may also be coupled to a voltage supply source (e.g., voltage supply source supplying reference or reset voltage $V_{AA}$) via transistor 70. Transistor 70 may be periodically activated by an assertion of control signal SHUT to reset photodiode 40.

Figure 3B:
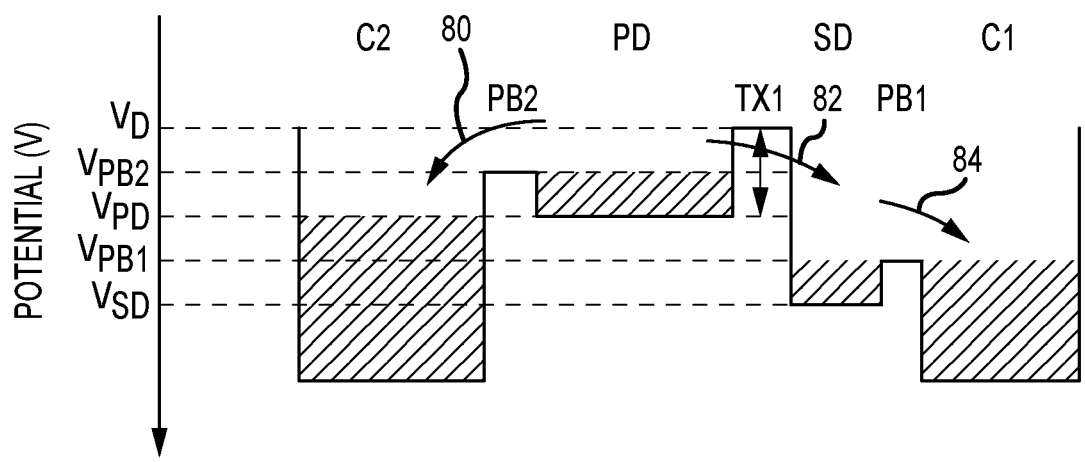
FIG. 3B is an electric potential diagram of photodiode, gates, potential barriers, and charge storage regions in an illustrative image sensor pixel of the type shown in FIG. 3A in accordance with an embodiment.

FIG. 3B is a voltage potential diagram for showing potential differences between different components in an image pixel such as image pixel 22 shown in FIG. 3A. As an example, charge storage structures or regions are depicted as wells PD, SD, C1, and C2, may respectively correspond to photodiode 40, storage diode 42, capacitor 50, and capacitor 52 in FIG. 3A. Each storage region may be associated with a pinned voltage (potential) level that defines the depth of the corresponding well. As an example, charge storage well PD (e.g., photodiode 40) may have pinned voltage level $V_{PD}$, and charge storage well SD (e.g., storage diode 42) may have a pinned voltage level $V_{SD}$.

Furthermore, potential barriers such as potential barrier PB1, potential barrier PB2, and transistor TX1 may correspond to potential barrier 46, potential barrier 48, and transistor 44 in FIG. 3A, as an example. Potential barrier PB2 may be associated with barrier voltage (potential) $V_{PB2}$, which determines charge that overflows from well PD to well C2 (e.g., via arrow 80). If desired, well PD may storage charges at potentials between reference voltage $V_0$ (e.g., a ground voltage) and pinned voltage $V_{PD}$. In this scenario, voltage $V_{PB2}$ may be between voltages $V_0$ and $V_{PD}$, and the amount of charge that overflows from well PD to well C2 may be defined by C2 capacity.

Barrier TX1 may be an adjustable potential barrier interposed between wells PD and SD. As an example, when control signal TX1 for transistor 44 in FIG. 2 is asserted, potential barrier TX1 may be moved (e.g., to voltage level $V_{PD}$), which transfers the charge stored in well PD to well SD (e.g., via arrow 82). Potential barrier PB1 may be associated with barrier voltage (potential) $V_{PB1}$, which determines charge that overflows from well SD to well C1 (e.g., via arrow 84). Voltage $V_{PB1}$ may be between photodiode pinned voltage $V_{PD}$ and storage diode pinned voltage $V_{SD}$, and the amount of charge that overflows from well SD to well C1 may be defined by C1 capacity. If desired, the storage capacities of capacitors C1 and C2 may each be significantly larger than those of photodiode PD and/or storage diode SD. As an example, capacitors may be formed as metal-insulator-metal (MiM) capacitors.

The voltage potential diagram shown in FIG. 3B is merely illustrative. Other components not shown in FIG. 3B may also be present in the illustrative pixel (e.g., other transistors, other charge storage structures, etc.).

Figure 4A:
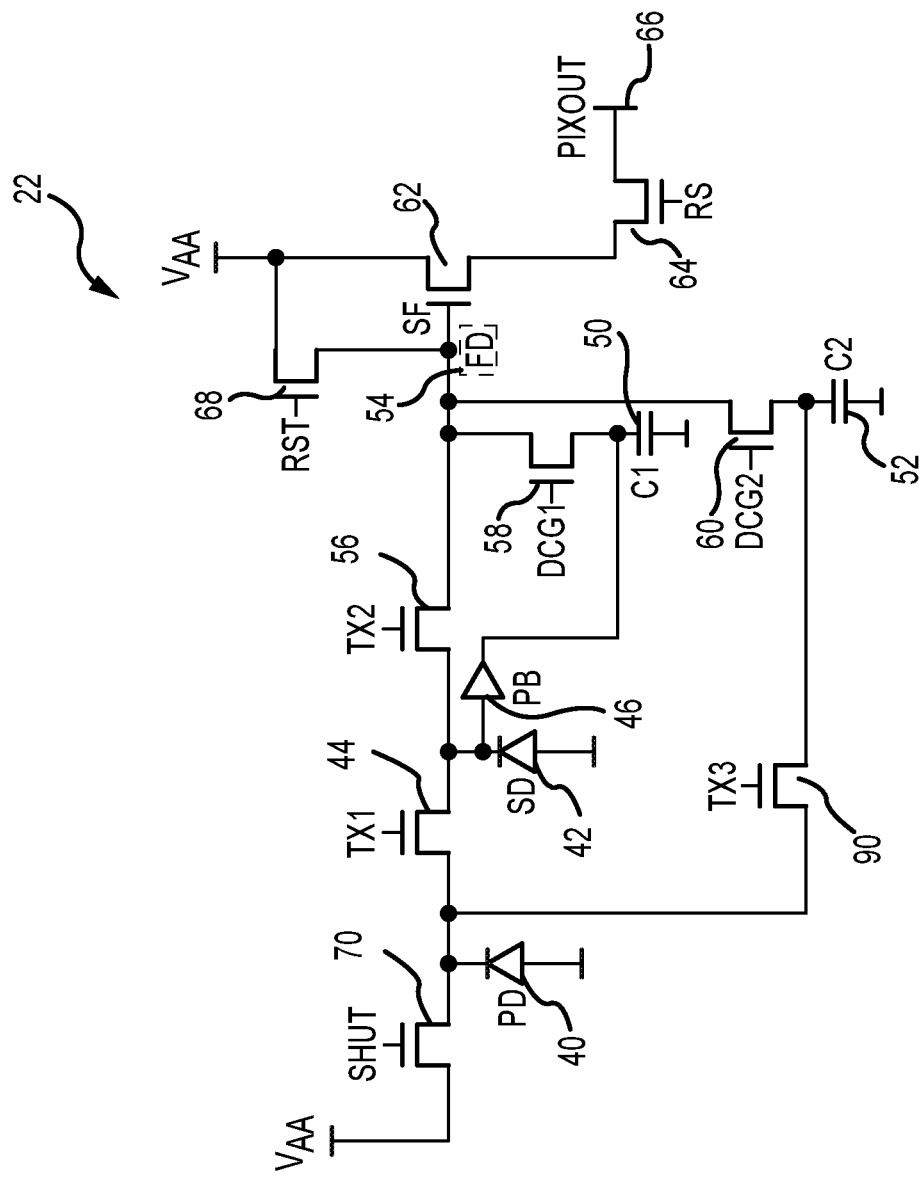
FIG. 4A is a circuit diagram of an illustrative image sensor pixel having capacitors respectively coupled to a potential barrier and a transistor in accordance with an embodiment.

FIG. 4A is a circuit diagram of an illustrative image sensor pixel (e.g., pixel 22) that includes a combination of a potential barrier (e.g., potential barrier 46) and a transistor (e.g., transistor 90). Transistor 90 may sometimes be referred to herein as a potential barrier transistor structure. If desired, transistor 90 may be implemented as a leaky transistor that is voltage-biased to leak charge (at a certain potential) across its channel region (e.g., even when transistor 90 is not activated or enabled), thereby implement a similar function as potential barrier 48 in FIG. 3A. Alternatively, transistor 90 may be implemented as a normal transistor leaks minimal charge when it is not activated or enabled.

Pixel 22 in FIG. 4A may include similar components and features as pixel 22 in FIG. 3A. For the sake of clarity and in order to not unnecessarily obscure the description of FIG. 4A, features in FIG. 4A having the same (numerical and/or alphabetical) references as those in FIG. 3A can be assumed to have similar functions and configurations. Referring to FIG. 4A, pixel 22 may include transistor 90 interposed between photodiode 40 and capacitor 52. By introducing a transistor (e.g., transistor 90) instead of a potential barrier (e.g., potential barrier 48 in FIG. 3A), pixel 22 in FIG. 4A may be configured with an adjustable potential barrier instead of a fixed potential barrier.

Figure 4B:
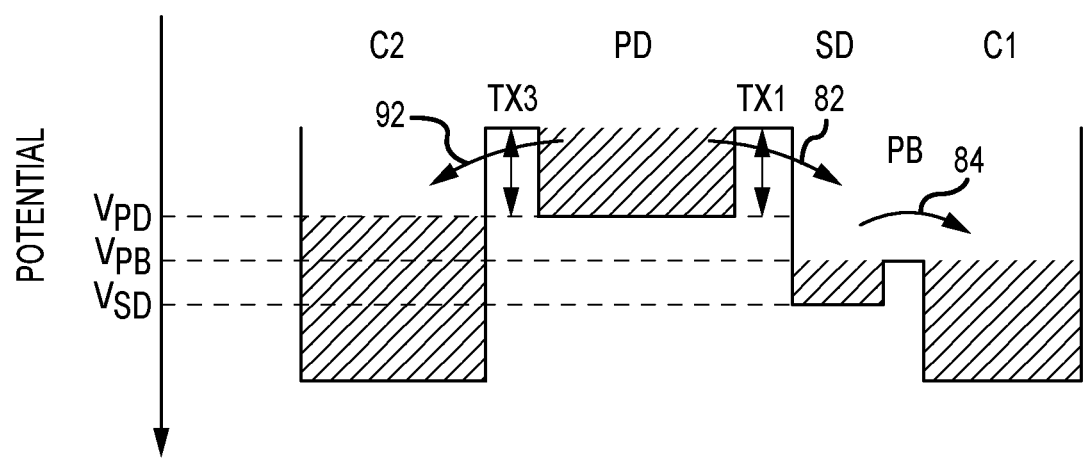
FIG. 4B is an electric potential diagram of photodiode, gates, potential barriers, and charge storage regions in an illustrative image sensor pixel of the type shown in FIG. 4A in accordance with an embodiment.

As shown in FIG. 4B, in comparison to FIG. 3B, an adjustable barrier TX3 associated with transistor 90 of FIG. 4A may be interposed between capacitor well C2 and photodiode well PD. As an example, when control signal TX3 for transistor 90 is asserted, potential barrier TX3 may be moved or lowered (e.g., to voltage level $V_{PD}$, to voltage level slightly lower than $V_{PD}$), which transfer the charge stored in well PD to well C2 (e.g., via arrow 92). The movement of charge associated with arrows 82 and 84 in FIG. 4B may be similar to that of FIG. 3B and is not further described for the sake of clarity. If desired, voltage $V_{PB}$ may be between photodiode pinned voltage $V_{PD}$ and storage diode pinned voltage $V_{SD}$, and the amount of charge that overflows from well SD to well C1 may be defined by C1 capacity.

Figure 5A:
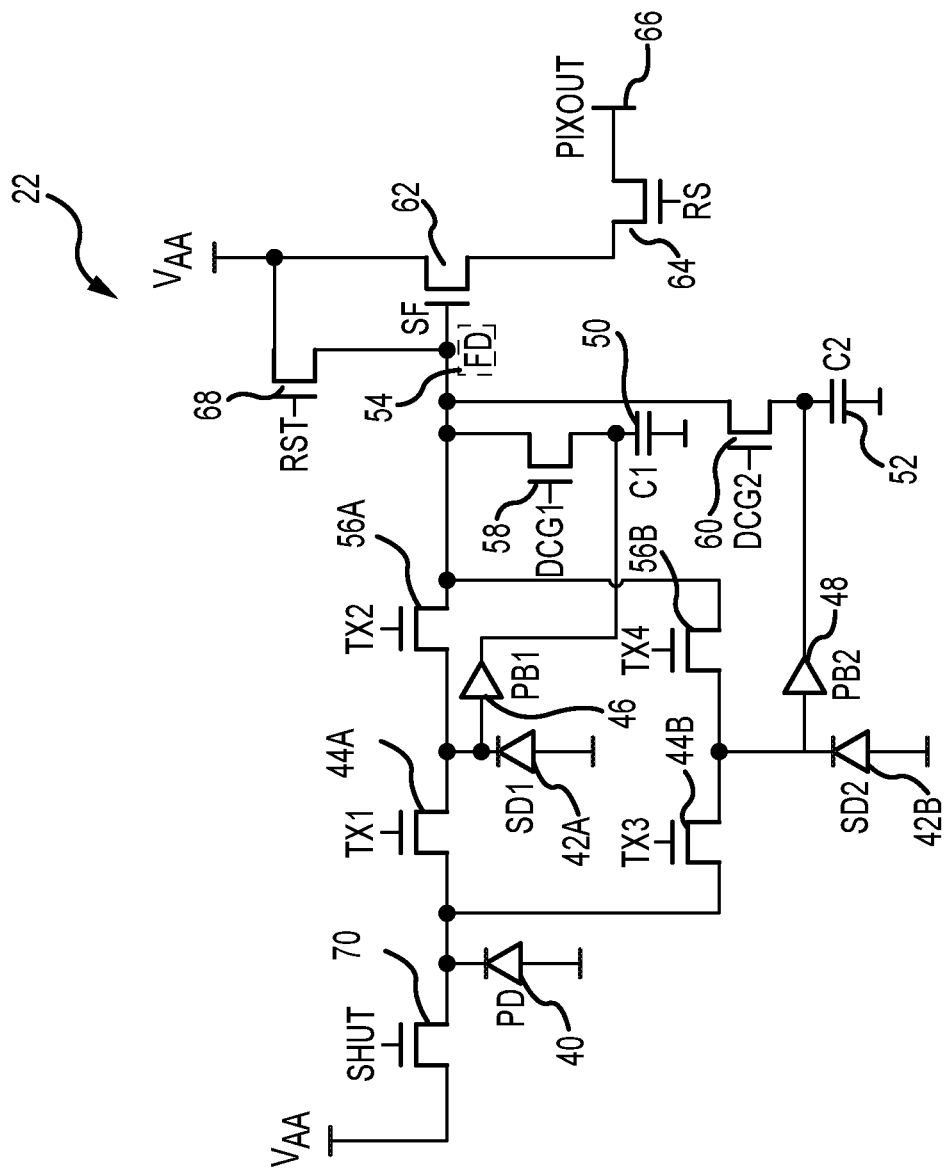
FIG. 5A is a circuit diagram of an illustrative image sensor pixel having capacitors respectively coupled to storage diodes in accordance with an embodiment.

If desired, image sensor pixels may further include additional storage diodes. FIG. 5A is a circuit diagram of an illustrative image sensor pixel (e.g., pixel 22) that includes multiple storage diodes coupled to respective capacitors via respective potential barriers. Pixel 22 in FIG. 5A may include similar components and features as pixel 22 in FIG. 3A. For the sake of clarity and in order to not unnecessarily obscure the description of FIG. 5A, features in FIG. 5A having the same (numerical and/or alphabetical) references as those in FIG. 3A can be assumed to have similar functions and configurations. Pixel 22 in FIG. 5A may include two storage diodes 42A and 42B coupled to photodiode 40 via two respective transfer transistors 44A and 44B. Storage diode 42A may be coupled to capacitor 50 via potential barrier 46. Storage diode 42B may be coupled to capacitor 52 via potential barrier 48. Storage diodes 42A and 42B may also be coupled to floating diffusion region 54 via respective transfer transistors 56A and 56B. In other words, two parallel paths may couple photodiode 40 to floating diffusion region 54. As an example, transistor 44A, storage diode 42A, and transistor 56A may be coupled along a first parallel path, and transistor 44B, storage diode 42B, and transistor 56B may be coupled along a second parallel path. As another example, storage diode 42A, potential barrier 46 and capacitor 50 may be coupled along a third parallel path, and storage diode 42B, potential barrier 48, and capacitor 52 may be coupled along a fourth parallel path.

Figure 5B:
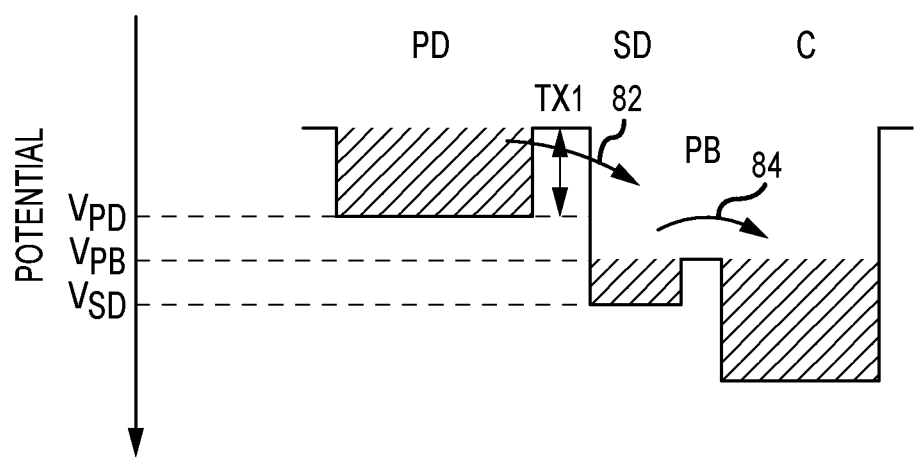
FIG. 5B is an electric potential diagram of photodiode, gates, potential barriers, and charge storage regions in an illustrative image sensor pixel of the type shown in FIG. 5A in accordance with an embodiment.

The example of pixel 22 in FIG. 5A is merely illustrative. If desired, any number of parallel paths may couple one or more photodiodes to one or more floating diffusion regions in a pixel. Each parallel path may include any number of transistors and may have any number of storage diodes coupled to that path. Additionally, if desired, a pixel may include any number of storage diodes coupled to respective capacitors along a number of corresponding paths FIG. 5B is a voltage potential diagram for showing potential differences between different components in an illustrative pixel such as pixel 22 of FIG. 5A. The movement of charge associated with arrows 82 and 84 in FIG. 5B may be similar to that of FIG. 3B. In particular, by asserting a control signal for a transistor, charge may move from photodiode well PD to storage diode well SD. Additionally, potential barrier PB may have an associated barrier voltage $V_{PB}$ that is between photodiode pinned voltage $V_{PD}$ and storage diode pinned voltage $V_{SD}$. The potential diagram of FIG. 5B shows a single path of charge movement from well PD to well SD to well C. However, this is merely illustrative. If desired, additional paths from a single photodiode to multiple capacitors via respective storage diodes may similarly implemented. In particular, pixel 22 in FIG. 5A shows two separate capacitors coupled to a single photodiode via two respective storage diodes. In this scenario, photodiode 40, storage diode 42A, capacitor 50, transistor 44A, and potential barrier 46 may have characteristics similar to those of wells PD, SD, and C, and barriers TX and PB in FIG. 5B, respectively and the same photodiode 40, storage diode 42B, capacitor 52, transistor 44B, and potential barrier 48 may also have characteristics similar to those of wells PD, SD, and C, and barriers TX, and PB in FIG. 5B, respectively.

If desired, image sensor pixels may incorporate storage gates in place of or in addition to storage diodes. FIG. 6A is a circuit diagram of an illustrative image sensor pixel (e.g., pixel 22) that includes a storage gate (sometimes referred to herein as a charge storage structure). Pixel 22 in FIG. 6A may include similar components and features as pixel 22 in FIG. 3A and/or pixel 22 in FIG. 5A. For the sake of clarity and in order to not unnecessarily obscure the description of FIG. 6A, features in FIG. 6A having the same or similar (numerical and/or alphabetical) references as those in FIGS. 3A and 5A can be assumed to have similar functions and configurations. Pixel 22 in FIG. 6A may include storage gate 43. Storage gate 43 may be interposed between photodiode 40 and potential barrier 48. Storage gate 43 may also be interposed between photodiode 40 and transistor 56B. As an example, storage gate 43 may function as both a transistor and a storage structure. In other words, storage gate 43 may include a charge storage structure underneath a transistor gate structure, where a control signal (e.g., control signal SG) may be asserted to access or connect the charge storage structure.

Figure 6B:
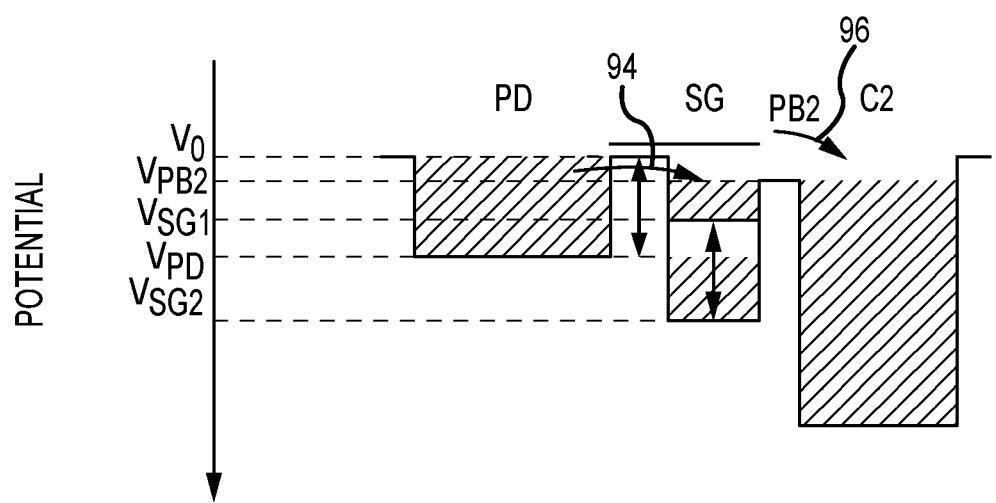
FIG. 6B is an electric potential diagram of photodiode, gates, potential barriers, and charge storage regions in an illustrative image sensor pixel of the type shown in FIG. 6A in accordance with an embodiment.

FIG. 6B is a voltage potential diagram for showing potential differences between different components in an illustrative pixel such as pixel 22 of FIG. 6A. In particular, photodiode well PD (e.g., corresponding to photodiode 40 in FIG. 6A) may be associated with pinning voltage $V_{PD}$ and reference voltage $V_0$ (e.g., a grounding voltage). Storage gate structure SG (e.g., corresponding to storage gate 43 in FIG. 6A) may include a charge storage well region and a potential barrier interposed between well PD and the charge storage well region of storage gate SG. The potential barrier associated with structure SG may be regulated by asserting a corresponding control signal (e.g., control signal SG in FIG. 6A). In other words, by asserting control signal SG, charge may be transferred from well PD to a well associated with storage gate structure SG (as indicated by arrow 94). Additionally, a potential barrier having a barrier voltage $V_{PB2}$ (e.g., corresponding to potential barrier 48 in FIG. 6A) may be interposed between storage gate structure SG and capacitor well C2 (e.g., corresponding to capacitor 52 in FIG. 6A). Barrier voltage $V_{PB2}$ may be between photodiode pinning (i.e., pinned) voltage $V_{PD}$ and reference voltage $V_0$ (e.g., a grounding voltage, 0V, a small potential above 0V, etc.). Storage gate structure SG may be provided with a potential bias. As an example, storage gate structure SG may have a first charge storage capacity associated with voltage level $V_{SG1}$, and the potential bias of storage gate structure SG may be subsequently adjusted to have a second charge storage capacity associated with voltage level $V_{SG2}$, and vice versa. By adjusting the potential bias of storage gate structure, differing amounts of charge may be transferred to capacitor well C2 over potential barrier PB2 (indicated by arrow 96). If desired, transistor 44, storage diode 42, potential barrier 46, and capacitor 50 in FIG. 6A may have similar potential difference relationships as depicted in FIG. 5B.

FIGS. 3A, 4A, 5A, and 6A are merely illustrative. If desired, an image sensor pixel may include any number of storage diodes and/or storage gates coupled to a photodiode. If desired, an image sensor pixel may include any number of capacitors coupled to a photodiode via any number of transistors, potential barriers, storage diodes, and/or storage gates.

Figure 7:
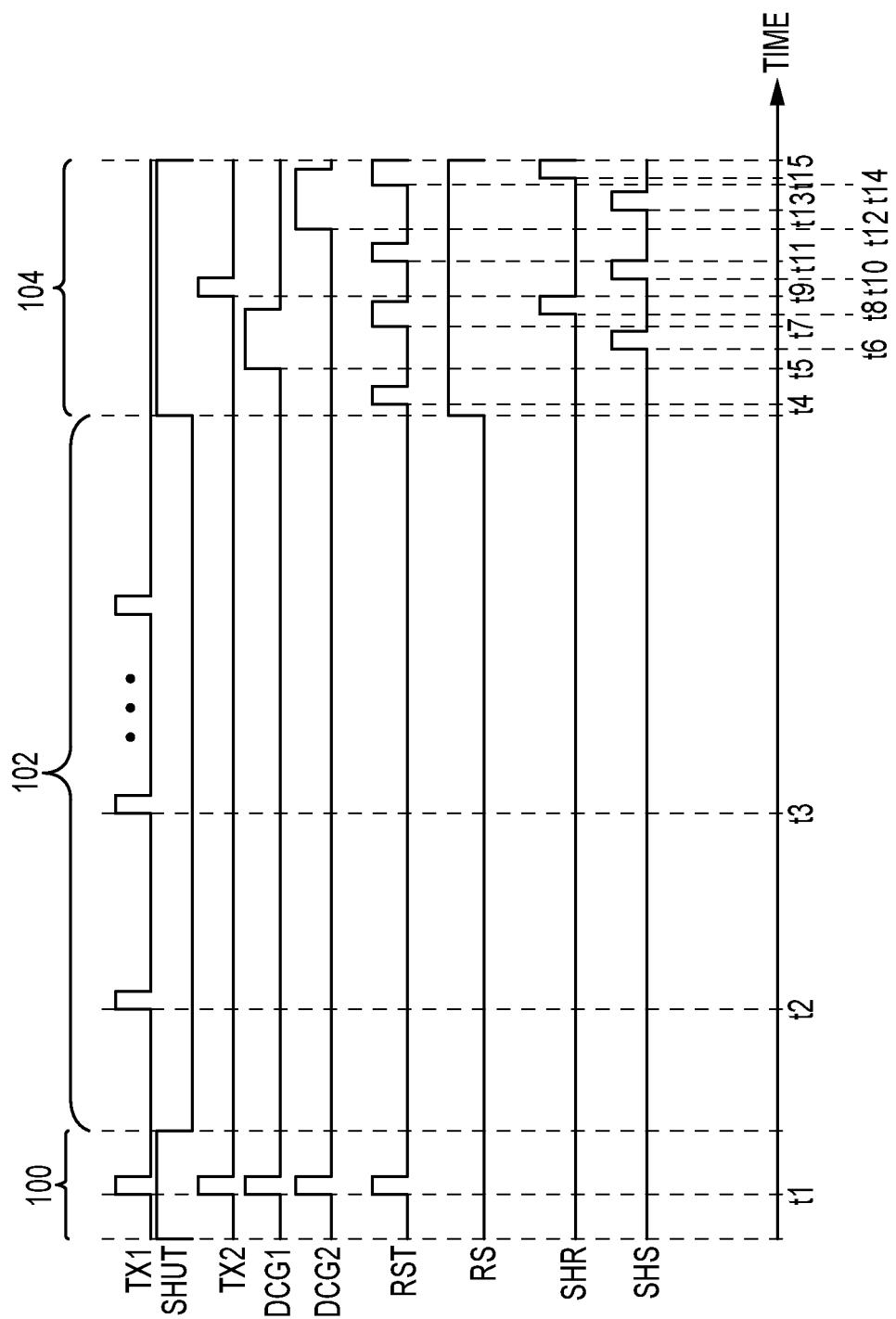
FIG. 7 is a timing diagram for operating an illustrative image sensor pixel of the type shown in FIG. 3A in accordance with an embodiment.

FIG. 7 is a timing diagram for operating an illustrative image sensor pixel (e.g., image sensor pixel 22 in FIG. 3A). In particular, operation of pixel 22 may include reset period 100, acquisition period 102 and readout period 104. During reset period 100, pixel 22 may assert the respective control signals of various transistors in pixel 22 to reset any charge storage regions to prepare for image signal acquisition. As an example, at time t1, pixel 22 may assert control signals TX1, SHUT, TX2, DCG1, DCG2, and RST, which control transistors 44, 70, 56, 58, 60, and 68 of pixel 22 in FIG. 3A, respectively. Reset period 100 may end (i.e., acquisition period 102 may begin) with the deassertion of transistor 70, which allows photodiode 40 in pixel 22 to begin generating and storing charge in response to image light. During signal acquisition period 102, control signal TX1 may be periodically asserted (e.g., at time t2, at time t3, etc.) to periodically transfer charge from photodiode 40 to storage diode 42 in FIG. 3, as an example. By performing short periodic assertions of control signal TX1, pixel 22 may be configured to perform light flickering mitigation operations. The corresponding image signals generated between respective assertions of control signal TX1 may be summed at storage diode 42.

As described in connection with FIGS. 3A and 3B, an amount of charge stored at photodiode 40 may overflow to capacitor 52 any time when the amount of charge stored at photodiode 40 exceeds the (voltage barrier) potential set by potential barrier 48. An amount of charge stored at storage diode 42 may overflow to capacitor 50 any time when the amount of charge stored at storage diode 42 exceeds the (voltage barrier) potential set by potential barrier 46.

After a suitable number of control signal TX1 assertions, acquisition period 102 may end, thereby beginning readout period 104. Control signal RS may be asserted throughout readout period 104 to perform readout operations for pixel 22. If desired, control signal SHUT may be asserted through readout period 104 to ensure that no additional charge is generated at photodiode 40. Multiple reset level and image level signals may be read out during readout period 104.

At time t4, control signal RST may be asserted to reset floating diffusion region 54 (e.g., reset floating diffusion region 54 to a reset or reference voltage level). At time t5, control signal DCG1 may be asserted to connect capacitor 50 to floating diffusion region 54 and transfer charge stored at capacitor 50 to floating diffusion region 54. Subsequently or simultaneously, an overflow image signal previously stored at capacitor 50 may be readout (e.g., at time t6). As an example, sample and hold circuitry downstream from the pixel may be activated (e.g., by asserting control signal SHS) to readout the overflow image level signal previously stored at capacitor 50. At time t7, control signal RST may be asserted to reset floating diffusion 54. If desired, control signal DCG1 may continue to be asserted while control signal RST is asserted such that capacitor 50 may be reset to a reset voltage level. Subsequently or simultaneously, a reset level signal may be readout (e.g., at time t8). As an example, sample and hold circuitry downstream from the pixel may be activated (e.g., by asserting control signal SHR) to readout the reset level signal at the floating diffusion region.

At time t9, control signal TX2 may be asserted to connect storage diode 42 to floating diffusion region 54 and transfer charge stored at storage diode 42 to floating diffusion region 54. Subsequently or simultaneously, an image level signal previously stored at storage diode at storage diode 42 may be readout (e.g., at time t10 by asserting control signal SHS). At time t11, control signal RST may be asserted to reset floating diffusion region 54. At time 12, control signal DCG2 may be asserted to connect capacitor 52 to floating diffusion region 54 and transfer charge stored at capacitor 52 to floating diffusion region. Subsequently or simultaneously, an overflow image signal previously stored at capacitor 52 may be readout (e.g., at time t13 by asserting control signal SHS). At time t14, control signal RST may be asserted to reset floating diffusion 54. If desired, control signal DCG2 may continue to be asserted while control signal is asserted such that capacitor 52 may be reset to a reset voltage level. Subsequently or simultaneously, a reset level signal may be readout (e.g., at time t15).

The timing diagram of FIG. 7 may be used in either a (sequential) global shutter mode of operation or a rolling shutter mode of operation. As an example, during operation, pixel 22 may generate a first exposure image signal (e.g., a T1 image signal, a long exposure image signal) based on the stored image signals at capacitor 50 and storage diode 42 and a second exposure image signal (e.g., a T2 image signal, a short exposure image signal) based on the stored image signal at capacitor 52. The exposure time ratio between the first and second exposures may be based on the frequency of assertions of control signal TX1 during acquisition period 102 and based on barrier potential $V_{PB2}$ of potential barrier 48. As an example, the first and second exposure image signals may be used to generate a HDR image signal in a HDR mode of operation.

The exemplary description of FIG. 7 using pixel 22 of FIGS. 3A and 3B is merely illustrative. If desired, any suitable pixel may be operated using the timing diagram of FIG. 7. If desired, the order of image/reset signal readout may be changed, and one or more signal readouts may be omitted.

Figure 8:
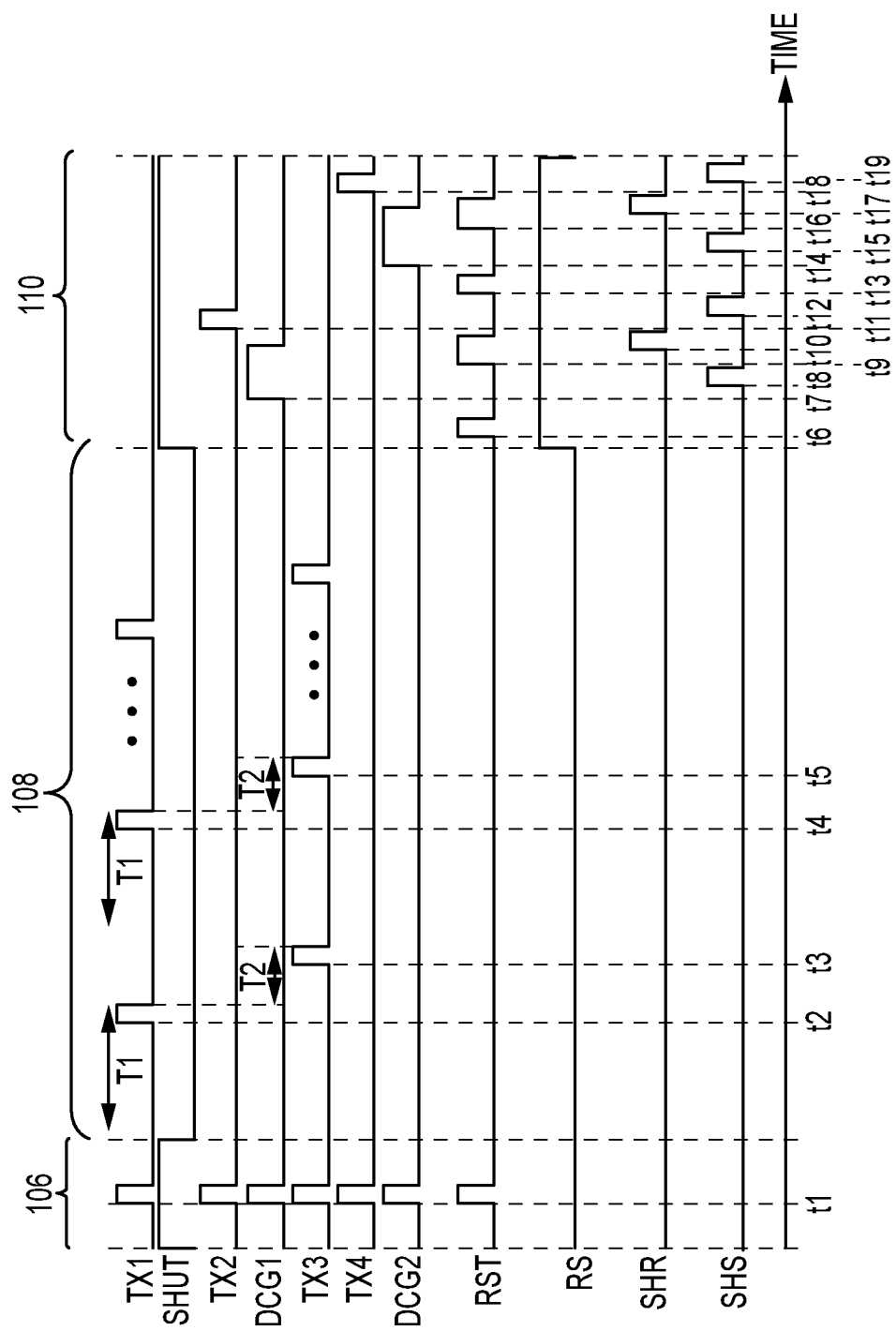
FIG. 8 is a timing diagram for operating illustrative image sensors of the types shown in FIGS. 4A, 5A, and 6A in accordance with an embodiment.

FIG. 8 is a timing diagram for operating an illustrative image sensor pixel (e.g., pixel 22 in FIG. 4A, pixel 22 in FIG. 5A, pixel 22 in FIG. 6A). In particular, operation of pixel 22 may include reset period 106, acquisition period 108, and readout period 110. Similar to period 100 in FIG. 7, during reset period 106, pixel 22 may assert the respective control signals of various transistors in pixel 22 to reset any charge storage regions to prepare for image signal acquisition. As an example, at time t1, pixel 22 may assert control signals TX1, SHUT, TX2, DCG1, TX3, TX4, DCG2, and RST, which control transistors 44A, 70, 56A, 58, 44B, 56B, 60, and 68 of pixel 22 in FIG. 5A, respectively. Reset period 106 may end with the deassertion of transistor 70, which configures photodiode 40 to begin gathering charge in response to incident light, thus beginning image acquisition period 108.

During signal acquisition period 108, control signal TX1 may be asserted at time t2 after time period T1 to transfer a corresponding portion of a first exposure period signal to storage diode 42A. After control signal TX1 is deasserted (e.g., is at a value that deactivates the corresponding transistor), photodiode 40 may gather charge for time period T2. The gathered charge for time period T2 may be transferred to storage diode 42B when control signal TX3 is asserted at time t3. The gathered charged may be a corresponding portion of a second exposure period signal. Pairs of TX1 assertions and TX3 assertions may be occur periodic (e.g., at set intervals based on time periods T1 and T2, at times t2 and t3, at times t4 and t5, etc.) throughout image signal acquisition period 108. As an example, charge generated based on time period T1 (e.g., charge generated after an SHUT deassertion, charge generated after TX3 deassertions, charge generated before and during TX1 assertions, etc.) may be summed at storage diode 42A to generate a first exposure signal (e.g., a long exposure signal). As another example, charge generated based on time period T2 (e.g., charge generated before an SHUT assertion, charge generated after TX1 deassertions, charge generated before and during TX3 assertions, etc.) may be summed at storage diode 42B to generate a second exposure signal (e.g., a short exposure signal). After a suitable number of pairs of TX1 assertions and TX3 assertions, acquisition period 106 may end.

Control signal RS may be asserted throughout readout period 110 to perform readout operations for pixel 22. If desired, control signal SHUT may be asserted through readout period 110 to ensure that no additional charge is generated at photodiode 40. Multiple reset level and image level signals may be read out during readout period 110.

At time t6, control signal RST may be asserted to reset floating diffusion region 54 to a reset voltage level. At time t7, control signal DCG1 may be asserted to connect capacitor 50 to floating diffusion region 54 and transfer charge stored at capacitor 50 to floating diffusion region 54. Subsequently or simultaneously, the charge previously stored at capacitor 50 (e.g., an overflow image level signal) may be read out (e.g., by activating sample and hold circuitry with the assertion of SHS at time t8). At time t9, control signal RST may be asserted to reset floating diffusion region 54 (and optionally capacitor 50, if control signal DCG1 remains asserted). Subsequently or simultaneously, the reset level signal at floating diffusion region 54 may be read out (e.g., by activating sample and hold circuitry with the assertion of SHR at time t10). At time t11, control signal TX2 may be asserted to connect storage diode 42A to floating diffusion region 54 and transfer charge stored at storage diode 42A to floating diffusion region 54. Subsequently or simultaneously, the charge previously stored at storage diode 42A (e.g. an image level signal) may be read out (e.g., by asserting signal SHS at time t12). This image level readout may be a correlated double sampling readout.

At time t13, control signal RST may be asserted to reset floating diffusion region 54. At time t14, control signal DCG2 may be asserted to connect capacitor 52 to floating diffusion region 54 and transfer charge stored at capacitor 52 to floating diffusion region 54. Subsequently or simultaneously, the charge previously stored at capacitor 52 (e.g., an overflow image level signal) may be read out (e.g., by asserting control signal SHS at time t15). At time t16, control signal RST may be asserted to reset floating diffusion region 54 (and optionally capacitor 52, if control signal DCG2 remains asserted). Subsequently or simultaneously, the reset level signal at floating diffusion region 54 may be read out (e.g., by asserting control signal SHR at time t17).

At time t18, control signal TX4 may be asserted to connect storage diode 42B to floating diffusion region 54 and transfer charge stored at storage diode 42B to floating diffusion region 54. Subsequently or simultaneously, the charge previously stored at storage diode 42B (e.g. an image level signal) may be read out (e.g., by asserting signal SHS at time t19). This image level readout may be a correlated double sampling readout.

By interlacing exposure period across multiple time periods (e.g., for T1 and T2), pixel 22 may capture flickering lights and perform light flickering mitigation. Additionally, the use of capacitors with potential barriers significantly extend the overflow capacity and improve pixel performance. The timing diagram of FIG. 8 may be used in either a (sequential) global shutter mode of operation or a rolling shutter mode of operation.

If desired, the first and second exposure image signals may be used to generate a HDR image signal in a HDR mode of operation. If desired, readout period 110 may be shortened for a more time efficient readout sequence.

While the timing diagram in FIG. 8 may be described herein in connection with pixel 22 in FIG. 5A, this is merely illustrative. The timing diagrams may similarly be used to operate other image pixels such as image pixel 22 in FIG. 4A and image pixel 22 in FIG. 6A. As an example, pixel 22 in FIG. 6A may operate using the timing diagram in FIG. 8 by analogously asserting control signal SG instead of control signal TX3. As another example, pixel 22 in FIG. 4A may operating using the timing diagram in FIG. 8 by omitting the use of control signal TX4 (e.g., by omitting an image level signal readout for storage diode 42B in FIG. 8). Additionally, the timing diagram of FIG. 8 may be analogously adjusted to operate image sensor with more than two storage diodes and/or more than two capacitors. As an example, corresponding transistors may be asserted to generate image signals for three or more exposure periods interlaced between respective short time periods T1, T2, T3, etc.

Figure 9:
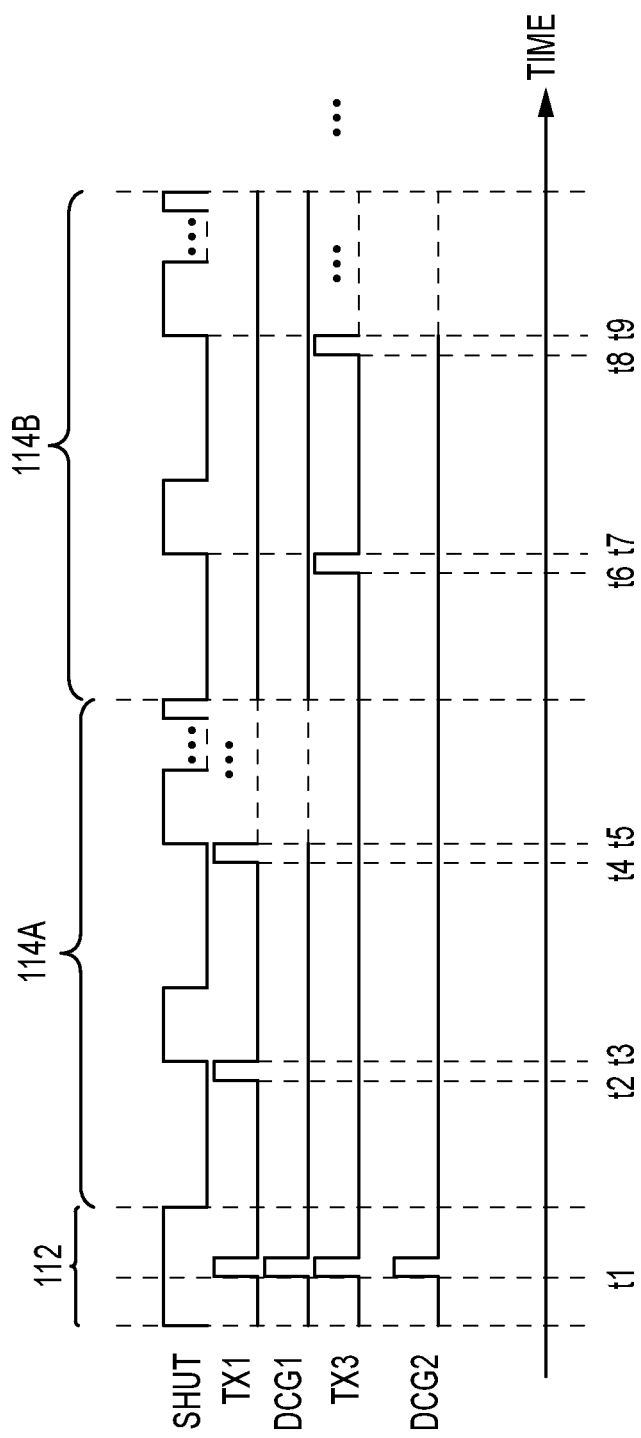
FIG. 9 is a timing diagram for operating illustrative image sensors of the types shown in FIGS. 5A and 6A in accordance with an embodiment.

If desired, image sensor pixels having multiple storages may operate in a pipelined global shutter mode of operation. FIG. 9 is a timing diagram for operating a pixel having two storages (e.g., pixel 22 in FIG. 5A and pixel 22 in FIG. 6A). As an example, operation of pixel 22 in FIG. 5A may begin with reset period 112, which is similar to reset period 106 in FIG. 8 (e.g., similar assertion of signals SHUT, TX1, DCG1, TX3, DCG2, etc.). For the sake of clarity and in order to not unnecessarily obscure the description of FIG. 9, reset period 112 is not further described and can be assumed to have analogous features as reset period 106.

In particular, pixel 22 in FIG. 5A may use the two parallel portions between photodiode 40 and floating diffusion region 54 separately. As an example, a first portion may include transistor 44A, storage diode 42A, potential barrier 46, capacitor 50, transistor 56A, and transistor 58, and a second portion may include transistor 44B, storage diode 42B, potential barrier 48, capacitor 52, transistor 56B, and transistor 60. The two portions of pixel 22 may perform signal acquisition independently, and may perform readout operations independently. In particular, during period 114A, the first portion of pixel 22 (in combination with photodiode 40) may perform signal acquisition by asserting signal TX1 associated with transistor 44A, as an example. During period 114A, the second portion of pixel 22 (in combination with floating diffusion region 54 and readout circuitry) may simultaneously perform readout operations (similar to period 104 in FIG. 7 with some corresponding readout operations omitted). During period 114B, the second portion of pixel 22 (in combination with photodiode 40) may perform signal acquisition by asserting signal TX3 associated with transistor 44B, as an example. During period 114B, the first portion of pixel 22 (in combination with floating diffusion region 54 and readout circuitry) may simultaneously perform readout operations (similar to period 104 in FIG. 7 with some corresponding readout operations omitted). As an example, any number of periods 114A and 114B may be present. Control signal SHUT may be periodically asserted (e.g., at times t3, t5, t7, t9, etc.) after the assertion of respective control signals TX1 or TX3 to reset photodiode 40 to a reset voltage and perform LFM operations, as an example.

By overlapping an image acquisition period for a first portion of a pixel with a reset period for a second portion of the pixel, the pixel may perform pipelined global shutter operations. During each readout period, first and second exposure signals may be generated from a capacitor and a corresponding storage diode, respectively. Because half of the charge stored in pixel 22 is used per readout period, pixel 22 may operate in a wide dynamic range mode of operation instead of a high dynamic range mode of operation, which uses all of the charge stored in pixel 22.

Image sensors having a pixel array with pixels 22 such as those of the types shown in FIGS. 3A, 4A, 5A, and/or 6A may be configured to include additional functionalities, such as multi-color operation with background subtraction, distance and near-infrared (NIR) image sensing operations with background subtraction, distance zone selective imaging operations, etc.

Figure 10A:
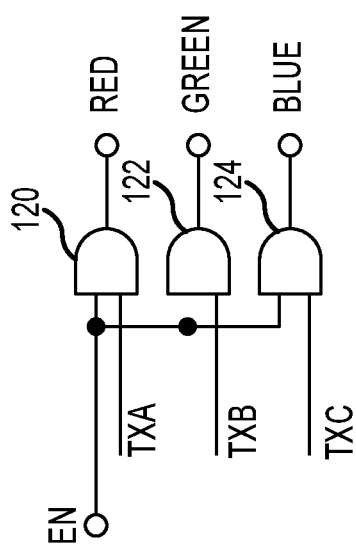
FIGS. 10A and 10B are diagrams for an illustrative system configured to perform multi-color operations in accordance with an embodiment.

As an example, FIG. 10A shows an illustrative circuit that may be provided in an image sensor to configure the image sensor to perform multi-color operation with background subtraction. The image sensor may also include additional circuitry (e.g., additional control circuitry, additional light sources, etc.). In particular, the additional circuitry may include logic AND gates 120, 122, and 124, the outputs of which are respective control signals for a red light source, a green light source, and a blue light source (e.g., a red LED, a green LED, and a blue LED). When a given output control signal is at a logic high, the corresponding LED may be activated to light an image scene with the respective color of the corresponding LED. Logic AND gates 120, 122, and 124 may all receive enable control signal EN at respective first inputs that enable the image sensor for multi-color operation (when the enable control signal is asserted). Logic AND gates 120, 122, and 124 may receive respective control signals TXA, TXB, and TXC as respective second inputs.

As an example, the image sensor may include pixels with four storages coupled to a photodiode. As an example, the image sensor may include pixels similar to pixel 22 in FIG. 5A with two additional storages provided in a similar fashion as storage diodes 42A and 42B (e.g. additional storage diodes 42C and 42D coupled between photodiode 40 and floating diffusion region 54, coupled to respective capacitors via respective potential barriers, etc.). In this scenario, the four storage diodes 42A, 42B, 42C, and 42D may be coupled to photodiode 40 via respective transfer transistors 44A, 44B, 44C, and 44D, which are respectively controlled by control signals TXA (similar to TX1 in FIG. 5A), TXB (similar to TX3 in FIG. 5A), TXC, and TXD.

Figure 10B:
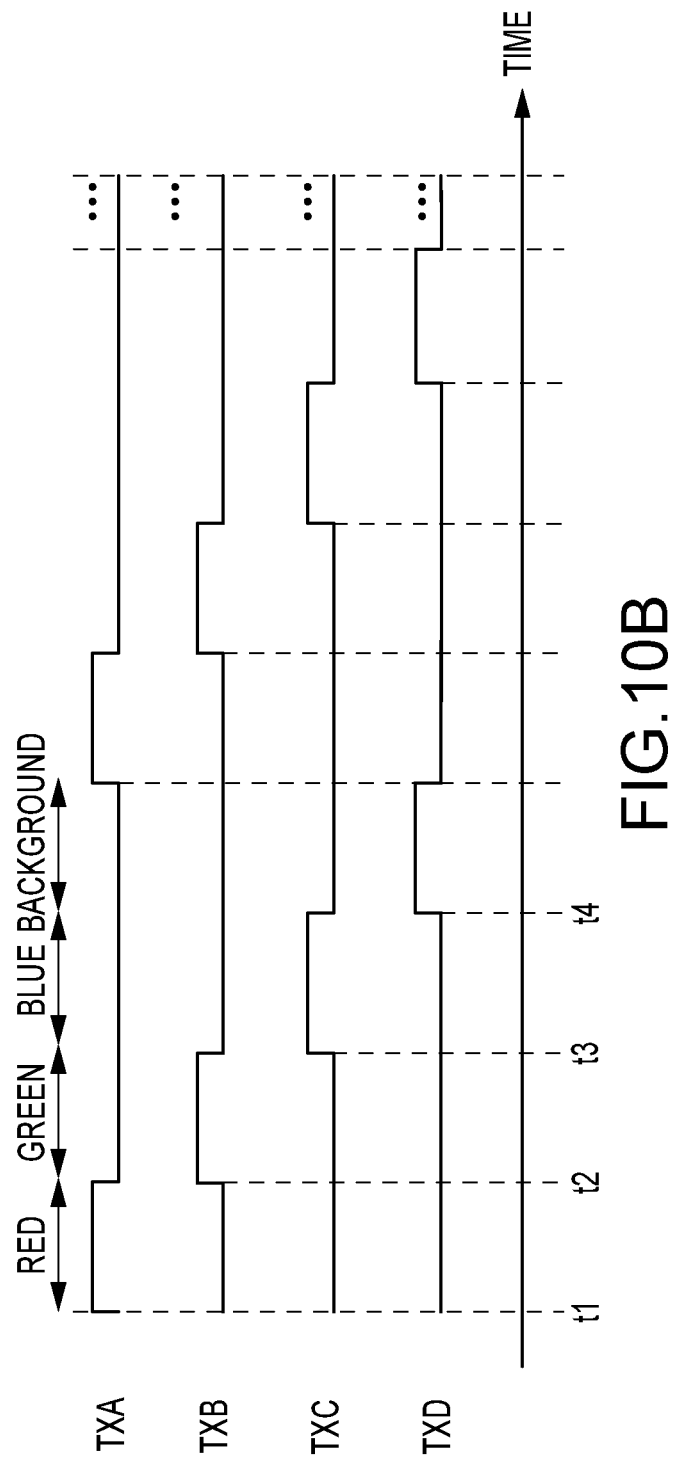

FIG. 10B shows a timing diagram for operating an illustrative image sensor such as the image sensor having the illustrative circuit shown in FIG. 10A and four storage diodes. For the sake of clarity and in order not to unnecessarily obscure the description of FIG. 10, the description of a reset period and a readout period, and the description of additional control signals in the image sensor is omitted. As an example, similar and analogous operations as those described in connection with FIG. 8 may occur. If desired, any suitable reset period and readout period may occur. If desired, any additional suitable control signals may be used.

The timing diagram shows a portion of acquisition period that may be used to obtain color specific image signals as well as a background image signal. Enable signal EN may be asserted throughout the operation of the image sensor operating using the timing diagram in FIG. 10B. In particular, at time t1, control signal TXA may be asserted to turn on a red light source to illuminate an image scene with red color. Simultaneously, control signal TXA may also connect a photodiode to a first storage diode configured to store a red image signal (and optionally an overflow red image signal at a corresponding capacitor). At time t2, control signal TXB may be asserted to turn on a green light source to illuminate the image scene with green color. Simultaneously, control signal TXB may also connect the photodiode to a second storage diode configured to store a green image signal (and optionally an overflow green image signal at a corresponding capacitor). At time t3, control signal TXC may be asserted to turn on a blue light source to illuminate the image scene with blue color. Simultaneously, control signal TXC may also connect the photodiode to a third storage diode configured to store a blue image signal (and optionally an overflow blue image signal at a corresponding capacitor). At time t4, all color specific lights sources may be turn off, and control signal TXD may be asserted to store a background image signal. Any desirable number of image acquisition cycles may be performed.

By using the image sensor in such a way, pixels in the image sensor may not require color filters (e.g., a color filter array formed over photodiodes), which increases pixel sensitivity. By subtracting the background image signal from each color specific image signal, the final (absolute) color image signals for red, green, and blue colors may be generated. The examples in FIGS. 10A and 10B are merely illustrative. If desired, image acquisition may extend to other spectral bands other than red, green, and/or blue (e.g., in addition to RGB signal acquisition with additional storages, in place of RGB signal acquisition). For example, image signals for different near-infrared bands may be acquired. The duration of color or band specific image signal acquisition may be varied to adjust the sensitivity of the image sensor to different colors or bands.

Figure 11A:
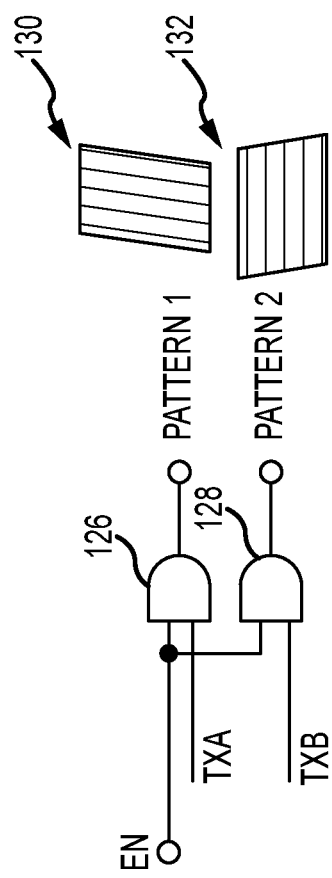
FIGS. 11A and 11B are diagrams for an illustrative system configured to perform distance measurement operations in accordance with an embodiment.
Figure 11B:
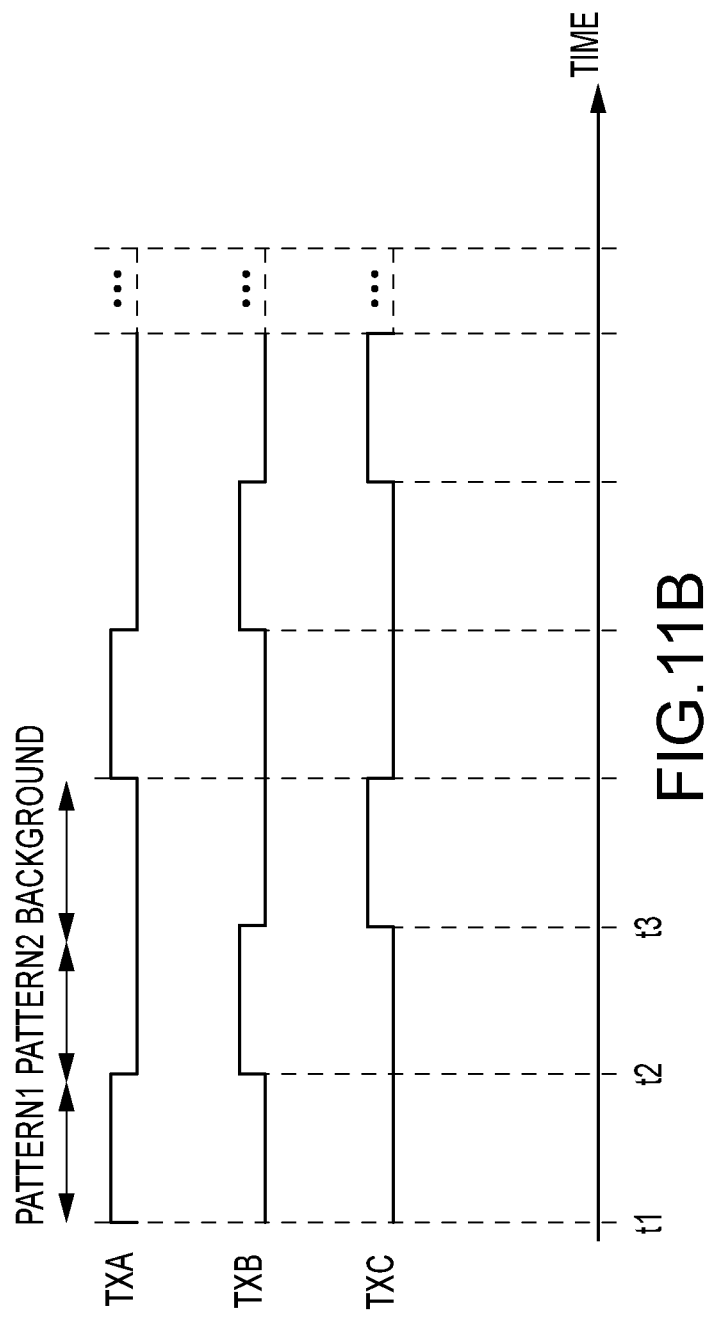

As described above, an image sensor may be configured to perform distance and NIR image sensing operations with background subtraction. FIG. 11A shows an illustrative circuit that may be provided in the image sensor to configured to image sensor to perform distance and NIR image sensing operations. The control circuit in FIG. 11A may be similar to the control circuit shown in FIG. 10A. In particular, logic AND gates 126 and 128 may output control signals that control pattern projection circuitry. As an example, when logic gate 126 outputs a logic high signal, the pattern projection circuitry may project a first pattern (e.g., vertical pattern 130) onto an image scene. As another example, when logic gate 128 outputs a logic high signal, the pattern projection circuitry may project a second patter (e.g., horizontal pattern 132) onto the image scene. FIG. 11B shows a timing diagram for operating an illustrative image sensor such as the image sensor having the illustrative circuit shown in FIG. 11A and three storage diodes. For the sake of clarity and in order not to unnecessarily obscure the description of FIG. 11B, the description of a reset period and a readout period, and the description of additional control signals in the image sensor is omitted. As an example, similar and analogous operations as those described in connection with FIG. 8 may occur. If desired, any suitable reset period and readout period may occur. If desired, any additional suitable control signals may be used.

The timing diagram shows a portion of acquisition period that may be used to obtain pattern specific image signals as well as a background image signal. Enable signal EN may be asserted throughout the operation of the image sensor operating using the timing diagram in FIG. 11B. In particular, at time t1, control signal TXA may be asserted to configure pattern projection circuitry to project a first pattern onto an image scene. Simultaneously, control signal TXA may also connect a photodiode to a first storage diode configured to store a first pattern image signal (and optionally an overflow first pattern image signal at a corresponding capacitor). At time t2, control signal TXB may be asserted to configure pattern projection circuitry to project a second patter onto the image scene. Simultaneously, control signal TXB may also connect the photodiode to a second storage diode configured to store a second pattern image signal (and optionally an overflow second pattern image signal at a corresponding capacitor). At time t3, all pattern specific light projection may be turn off, and control signal TXC may be asserted to store a background image signal. Any desirable number of image acquisition cycles may be performed.

By using an image sensor such a way, improved three-dimensional distance measurement can be obtained. By subtracting the background image signal from each of the pattern image signal, the final (absolute) pattern image signals for pattern 1 and pattern 2 may be generated. Because two patterns are used, distance estimation of objects in an image scene may be improved. The examples in FIGS. 11A and 11B are merely illustrative. If desired, image acquisition may include additional patterns, additional spectral band light sources (e.g., as described in connection with FIGS. 10A and 10B), and additional NIR light sources with corresponding additional storage structures. For example, NIR image signals may be generated while generating distance image data based on pattern image signals. Background subtraction as described in connection with FIGS. 10B and 11B may improve NIR image quality.

Figure 12A:
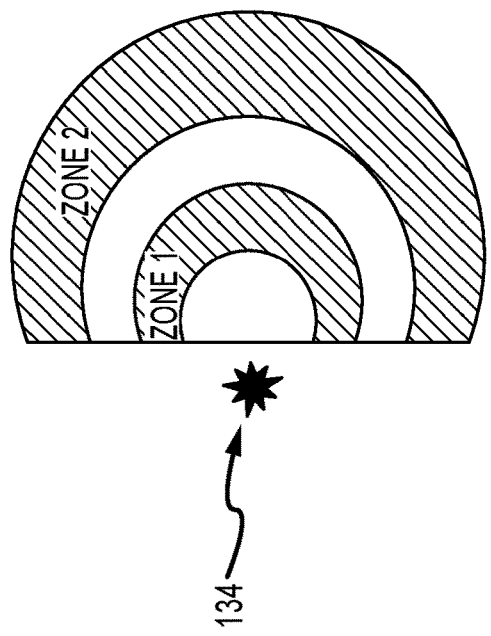
FIGS. 12A and 12B are diagrams for an illustrative system configured to perform distance zone selective imaging operations in accordance with an embodiment.

As an example, FIG. 12A shows an illustrative diagram of performing zone selective imaging operations using an image sensor. As an example, the image sensor may include a light source and pixels with three storage diodes in similar configurations as those of FIG. 5A. As shown in FIG. 12A, light pulse 134 may be used to illuminate an image scene. The propagation of light pulse 134 may reach a closer zone (e.g., Zone 1) at a first time, and a farther zone (e.g., Zone 2) at a second later time. The image sensor may selective capture image signals associated with an image scene within the first zone and an image scene within the second zone.

Figure 12B:
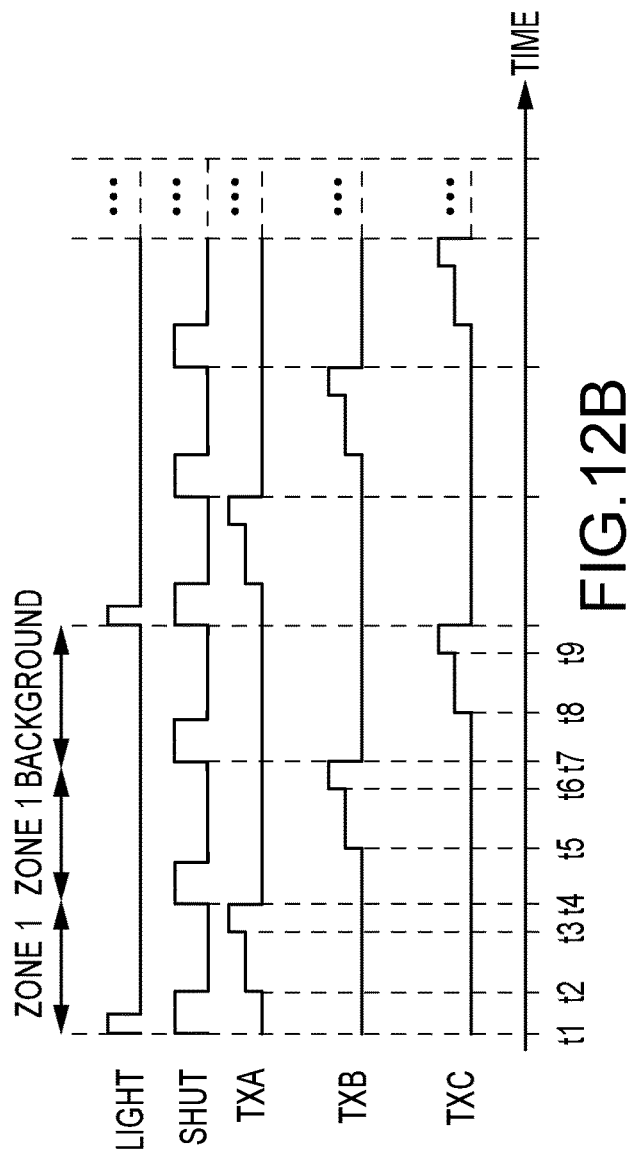

FIG. 12B is a timing diagram for operating an illustrative image sensor to perform zone selective imaging operations. For the sake of clarity and in order not to unnecessarily obscure the description of FIG. 12B, the description of a reset period and a readout period, and the description of additional control signals in the image sensor is omitted. As an example, similar and analogous operations as those described in connection with FIG. 8 may occur. If desired, any suitable reset period and readout period may occur. If desired, any additional suitable control signals may be used.

Referencing FIG. 12B, at time t1, short light pulse may be generated and control signal SHUT may be asserted to reset a photodiode. The time period during which control signal SHUT is asserted may determine the distance of a first zone of interest (e.g., Zone 1) from the light source generating light pulse 134. At time t2, control signal TXA may be partially asserted (e.g., may have a signal value between a logic high value and a logic low value). At time t3, control signal TXA may be fully asserted (e.g., may have a signal value that is at the logic high value) to store image signals associated with a first zone. Because the propagation of the light pulse across difference zones may take place in very short amount of time (e.g., on the order of nanoseconds, tens of nanoseconds, etc.), control signals may be partially asserted such that the full assertion can be achieved in a reasonable in a time period (e.g., to enable fast transistor switching). The time period during which control signal TXA is asserted (partially and fully) may determine a width of the first zone of interest (e.g., how large the first zone is).

At times t4, t5, and t6, similar operations may take place for a second zone of interest (e.g., Zone 2). The time period during which control signal SHUT is asserted (beginning at time t4) may determine the distance of the second zone of interest from the first zone of interest. The time period during which control signal TXB is asserted (partially and fully) may determine a width of the second zone of interest. At times t7, t8, and t9, similar operations may take place for a background of the image scene. The generated background image signal may be subtracted from the generated image signals for Zone 1 and Zone 2 to generate final (absolute) image signals for Zone 1 and Zone. Similar to the descriptions of timing diagrams in FIGS. 10B and 11B, each of control signals TXA, TXB, TXC in FIG. 12B may connect a photodiode to a respective storage diode. The examples in FIGS. 12A and 12B are merely illustrative. If desired, image signals for any suitable number of zones may be acquired.

Figure 13:
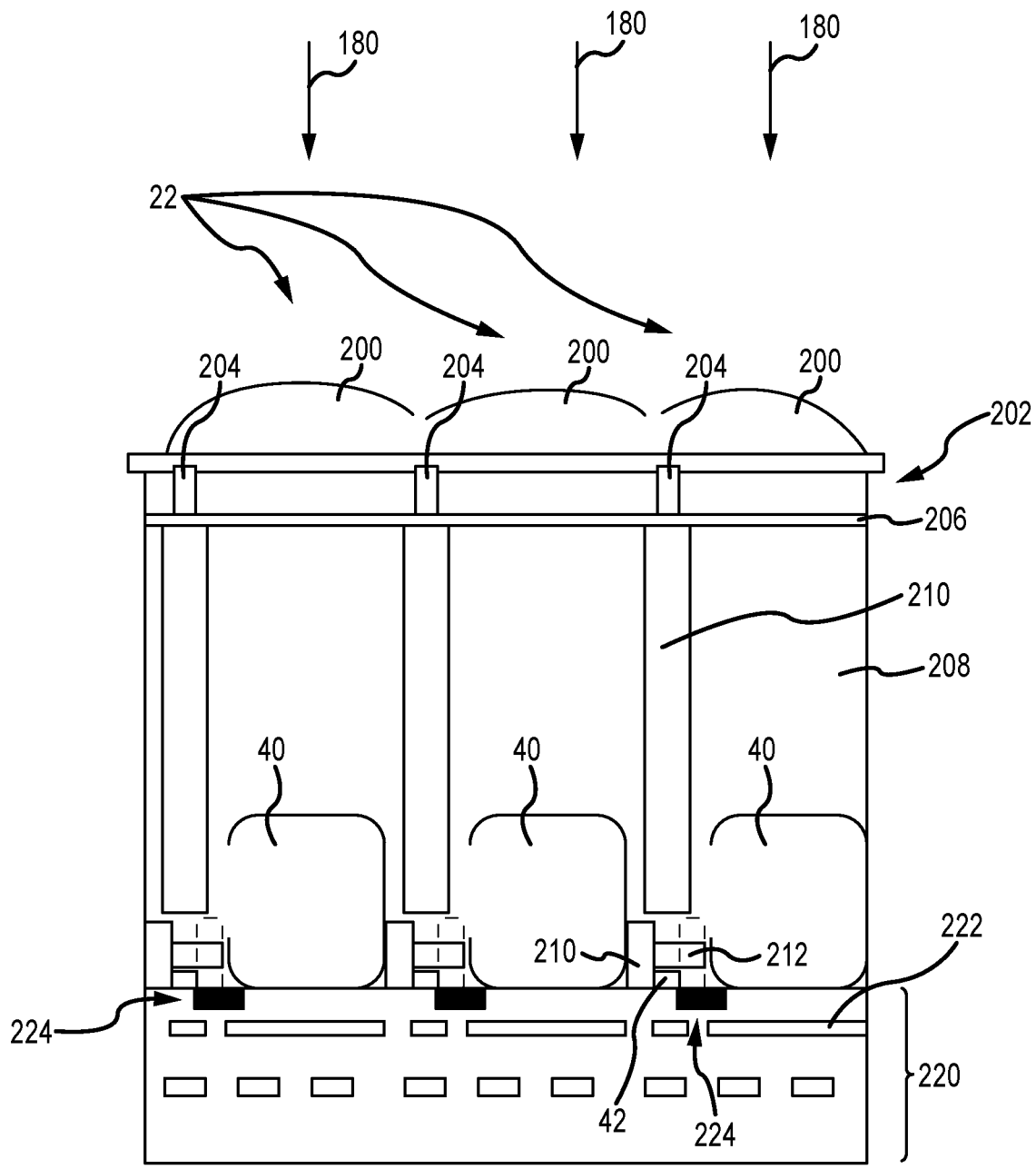
FIG. 13 is a cross-sectional view of an illustrative image sensor pixel of the types shown in FIGS. 3A, 4A, 5A, and 6A in accordance with an embodiment.

FIG. 13 is a cross-sectional view of illustrative image sensor pixels (e.g., pixels 22) such as those of the types shown in FIGS. 3A, 4A, 5A, and 6A. In particular, each pixel 22 may include a respective photodiode 40, microlens 200 for over photodiode 40, and color filter array 202 between microlens 200 and anti-reflective coating 206. Color filter array 202 may filters of color red, green, blue, yellow, clear, or any other suitable color. Color filter elements may be separated by metal grid structure 204. Graded epitaxial layers 208 may be interposed between color filters and photodiode 40. Isolation structure 210 may separate individual pixels from one another and minimize crosstalk between pixels. As an example, isolation structures 210 may include front-side deep trench isolation structures, back-side deep trench isolation structures, shallow trench isolation structures. As an example, back-side deep trench isolation structures may extend along the thickness (depth) of the silicon substrate, in which layers 208 and photodiode 40 are formed. In this scenario, the thickness of the silicon substrate may be 4-5 micrometers. As another example, both front-side and back-side deep trench isolation structure may extend along the thickness of the silicon substrate. In this scenario, the thickness of the silicon substrate may be extended to 8 or more micrometers (e.g., 8-10 micrometers).

Pixels 22 may be back-side illuminated pixels. In other words, pixels 22 may receive light 180 from a side of pixels 22 that opposes the side of pixels 22 at which metal layers or metal stacks are formed (e.g. metal layers in portion 220). However, this is merely illustrative. If desired, pixels 22 may be implemented as front-side illuminated pixels.

Each pixel 22 may include one or more storage diodes 42. In particular, storage diodes 42 may be aligned with isolation structures 210 on one or more sides of storage diodes 42 (e.g., back-side deep trench isolation structures may be aligned with storage diodes 42 on a first side, shallow trench isolation structures may be aligned with storage diodes on second and/or third sides, etc.). In such a way, storage diodes 42 may be optically and electrically protected from stray light and/or crosstalk. Photodiode 40 may also optically and electrically protect storage diodes 42 from stray light and/or crosstalk. As an example, storage diode 40 may extend to surround storage diodes 42 on multiple sides (e.g., on two sides). Portion 222 may include metal reflectors 222, transistor structures 224, metal layers, dielectric layers, and/or other circuitry. If desired, capacitors coupled to storage diodes 42 may be formed in portion 222.

The example of FIG. 13 is merely illustrative, if desired portions of each pixel 22 may be formed on multiple substrates (e.g., in separate top and bottom layers connected by per-pixel interconnect structures, in a stacked die configuration, etc.).

Figure 14:
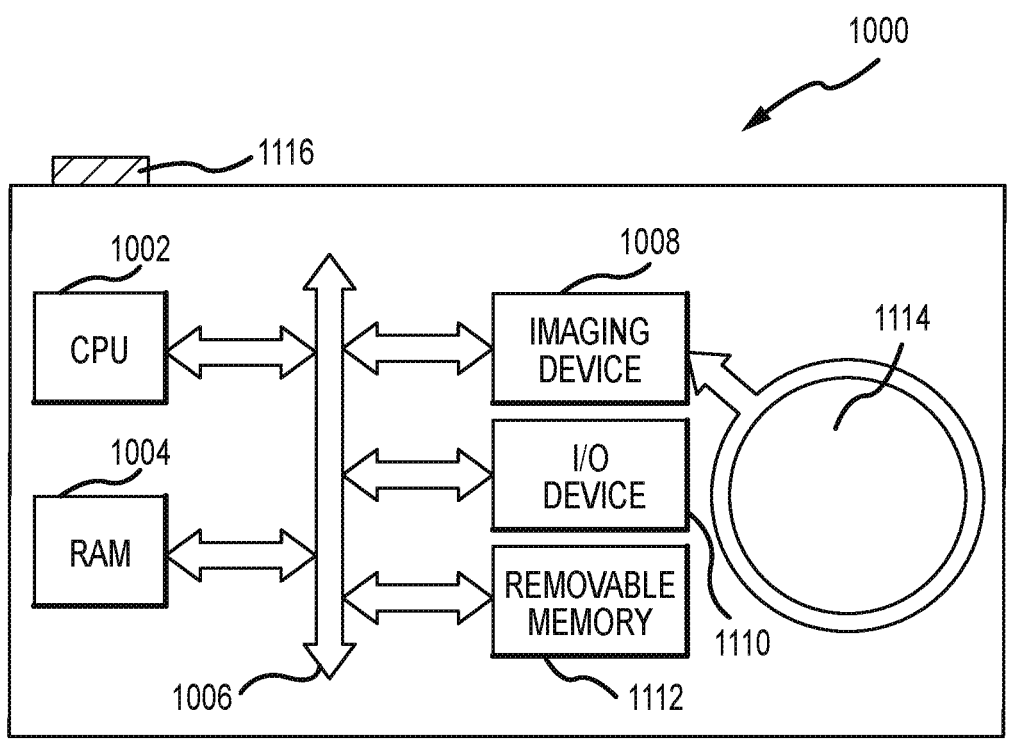
FIG. 14 is a block diagram of a processor system employing the embodiments of FIGS. 1-13 in accordance with an embodiment of the present invention.

FIG. 14 is a simplified diagram of an illustrative processor system 1000, such as a digital camera, which includes an imaging device 1008 (e.g., the camera module of FIG. 1) employing an imager having global shutter pixels as described above in connection with FIGS. 1-13. Without being limiting, such a system could include a computer system, still or video camera system, scanner, machine vision system, vehicle navigation system, video phone, surveillance system, auto focus system, star tracker system, motion detection system, image stabilization system, and other systems employing an imaging device.

Processor system 1000, for example a digital still or video camera system, generally includes a lens 1114 for focusing an image onto one or more pixel array in imaging device 1008 when a shutter release button 1116 is pressed and a central processing unit (CPU) 1002 such as a microprocessor which controls camera and one or more image flow functions. Processing unit 1102 can communicate with one or more input-output (I/O) devices 1110 over a system bus 1006. Imaging device 1008 may also communicate with CPU 1002 over bus 1006. System 1000 may also include random access memory (RAM) 1004 and can optionally include removable memory 1112, such as flash memory, which can also communicate with CPU 1002 over the bus 1006. Imaging device 1008 may be combined with the CPU, with or without memory storage on a single integrated circuit or on a different chip. Although bus 1006 is illustrated as a single bus, it may be one or more busses, bridges or other communication paths used to interconnect system components of system 1000.

Various embodiments have been described illustrating systems and methods for generating images using image sensor pixels having multiple charge storage structure coupled to potential barriers.

The image sensor pixel may include a photosensitive region (e.g., a photodiode) that generates charge in response to image light or incident light, a floating diffusion region, a first charge storage region (e.g., a first capacitor) coupled to the floating diffusion region via a first transistor, and a first potential barrier structure (e.g., a barrier diode structure, a barrier transistor structure, etc.). The first potential barrier structure may be configured to transfer a portion of the generated charge directly from the photosensitive region to the first charge storage region. The photosensitive region may be a pinned storage element having a well capacity defined by a reference potential (i.e., a reference voltage level) and a pinned potential (i.e., a pinned voltage level). The first potential barrier structure may have a pinned barrier potential between the reference potential and the pinned potential.

The image sensor pixel may also include a storage diode coupled to the photosensitive region via a transfer transistor.

A second potential barrier structure may separate the storage diode from a second charge storage region (e.g., a second capacitor). The storage diode may have a well capacity at least partly defined by a pinned potential. The second potential barrier structure may have a pinned barrier potential between the pinned potential associated with the photosensitive region and the pinned potential associated with the storage diode. The second charge storage region may be coupled to the floating diffusion region via a second transistor. A reset transistor (e.g., reset transistor 68 in FIG. 3A) may have a first source-drain terminal directly coupled to the floating diffusion region and a second source-drain terminal directly coupled to a power supply terminal.

The first potential barrier structure may transfer a first amount of the generated charge (e.g., determined by the pinned barrier potential for the first potential barrier structure) to the first charge storage region. The transfer transistor may be activated to transfer a second amount of the generated charge (e.g., a remaining amount of the generated charge stored at the photosensitive region) to the storage diode. The second potential barrier structure may transfer a portion of the second amount of the generated charge (e.g., determined by the pinned barrier potential for the second potential barrier structure) to the second charge storage region. Readout circuitry (e.g., source following transistor, row select transistor, etc.) may separately perform respective readout operations for the first amount of generated charge, the portion of the second amount of generated charge, and a remaining portion of the second amount of the generated charge. The reset transistor may separately reset the floating diffusion region to a reference voltage level before performing each of the respective readout operations. If desired, the transfer transistor may be active to transfer the second amount of the generated charge while performing the readout operation for the first amount of the generated charge.

As an example, the image sensor pixel may have first and second charge storage structure respectively coupled to first and second parallel paths that connect the photosensitive region to the floating diffusion region. First and second storage diodes may be respectively coupled along the first and second paths. First and second capacitors may be respectively coupled along first and second paths. Respective transfer transistors may be interposed between the photosensitive region and corresponding storage diodes. Respective transfer transistors may be interposed between the floating diffusion regions and corresponding storage diodes. As another example, each storage diode may be used to generate a respective image signal for a corresponding spectral band.

As yet another example, each storage diode may be used to generate a respective image signal for a corresponding spatial zone.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor pixel, comprising:
   a photosensitive region that generates charge in response to incident light;
   a floating diffusion region;
   a charge storage region coupled to the floating diffusion region via a transistor; and
   a potential barrier structure that separates the photosensitive region from the charge storage region, wherein the potential barrier structure comprises a barrier diode structure and wherein the potential barrier structure is configured to transfer a portion of the generated charged from the photosensitive region to the charge storage region.

2. The image sensor pixel defined in claim 1, wherein the photosensitive region has a well capacity defined by a reference potential and a pinned potential and the potential barrier structure has a pinned barrier potential between the reference potential and the pinned potential.

3. The image sensor pixel defined in claim 2, further comprising:
   a storage diode coupled to the photosensitive region via a transfer transistor; and
   an additional potential barrier structure that separates the storage diode from an additional charge storage region.

4. The image sensor pixel defined in claim 3, wherein the storage diode has a well capacity at least partly defined by a pinned potential, and the additional potential barrier structure has a pinned barrier potential between the pinned potential associated with the photosensitive region and the pinned potential associated with the storage diode.

5. The image sensor pixel defined in claim 3, wherein the additional charge storage region is coupled to the floating diffusion region via an additional transistor.

6. The image sensor pixel defined in claim 5, further comprising:
   a reset transistor coupling the floating diffusion region to a power supply terminal.

7. The image sensor pixel defined in claim 1, wherein the potential barrier structure, first additional transistor, and an additional transistor separate the photosensitive region from the charge storage region.

8. A method of operating an image sensor pixel that includes a photodiode coupled to a first charge storage region via a storage diode and coupled to a second charge storage region via a potential barrier structure, and a floating diffusion region coupled to the first and second charge storage regions, wherein a transfer transistor is interposed between the photodiode and the storage diode, the method comprising:
   with the photodiode, generating charge in response to incident light;
   with the potential barrier structure, transferring a first amount of the generated charge to the second charge storage region;
   activating the transfer transistor to transfer a second amount of the generated charge to the storage diode;
   transferring a portion of the second amount of the generated charge to the first charge storage region; and
   separately performing respective readout operations for the first amount of generated charge, the portion of the second amount of the generated charge, and a remaining portion of the second amount of the generated charge.

9. The method defined in claim 8, wherein the image sensor pixel comprises a reset transistor coupled to the floating diffusion region, the method further comprising:
   separately resetting the floating diffusion region to a reference voltage level before performing each of the respective readout operations.

10. The method defined in claim 8, wherein the first amount of the generated charge is determined by a barrier voltage level associated with the potential barrier structure.

11. The method defined in claim 10, wherein the image sensor pixel includes an additional potential barrier structure interposed between the storage diode and the first charge storage region, and the portion of the second amount of the generated charge is determined by a barrier voltage level associated with the additional potential barrier structure.

12. The method defined in claim 8, wherein the image sensor pixel includes an additional storage diode interposed between the photodiode and the potential barrier structure, and wherein activating the transfer transistor comprises transferring the second amount of the generated charge while performing the readout operation for the first amount of the generated charge.

13. The method defined in claim 8, wherein the image sensor pixel includes at least one additional storage diode interposed between the photodiode and the second charge storage region, the method further comprising:
   generating an image signal of a first spectral band based on charge stored at the storage diode; and
   generating an image signal of a second spectral band based on charge stored at the at least one additional storage diode.

14. The method defined in claim 8, wherein the image sensor pixel includes at least one additional storage diode interposed between the photodiode and the second charge storage region, the method further comprising:
   generating an image signal associated with a first spatial zone in an image scene based on charge stored at the storage diode; and
   generating an image signal associated with a second spatial zone in the image scene based on charge stored at the at least one additional storage diode.

15. An image sensor pixel, comprising:
   a photosensitive region that generates charge in response to incident light;
   a floating diffusion region;
   a first charge storage structure coupled to a first path that connects the photosensitive region to the floating diffusion region; and
   a second charge storage structure coupled to a second path that connects the photosensitive region to the floating diffusion region, wherein a potential barrier structure is coupled along the second path and wherein the first and second paths are coupled in parallel between the photosensitive region and the floating diffusion region.

16. The image sensor pixel defined in claim 15, further comprising:
   first and second storage diodes respectively coupled along the first and second paths, wherein the first charge storage structure comprises a first capacitor, the second charge storage structure comprises a second capacitor, the potential barrier structure is interposed between the second storage diode and the second capacitor, and an additional potential barrier structure is interposed between the first storage diode and the first capacitor.

17. The image sensor pixel defined in claim 16, further comprising:
   first and second transfer transistors, wherein the first transfer transistor is interposed between the photosensitive region and the first storage diode and the second transfer transistor is interposed between the first storage diode and the floating diffusion region; and
   third and fourth transfer transistors, wherein the third transfer transistor is interposed between the photosensitive region and the second storage diode and the fourth transfer transistor is interposed between the second storage diode and the floating diffusion region.

18. The image sensor pixel defined in claim 15 wherein the potential barrier structure is coupled to the photosensitive region and has a barrier voltage level between a reference voltage level and a pinned voltage level for the photosensitive region.

19. The image sensor pixel defined in claim 15, further comprising:
   a storage gate interposed between the photosensitive region and the potential barrier structure.

20. The image sensor pixel defined in claim 15, further comprising:
   first and second storage diodes respectively coupled along the first and second paths; and
   isolation structures, wherein the first and second storage diodes are optically and electrically shielded by at least the isolation structures.

21. The image sensor pixel defined in claim 15, wherein the first charge storage structure comprises a first capacitor and the second charge storage structure comprises a second capacitor.

* * * * *